United States Patent
Zhang et al.

(10) Patent No.: US 12,105,036 B2
(45) Date of Patent: Oct. 1, 2024

(54) METHOD AND APPARATUS FOR MONITORING BEAM PROFILE AND POWER

(71) Applicant: ASML NETHERLANDS B.V., Veldhoven (NL)

(72) Inventors: Jian Zhang, San Jose, CA (US); Ning Ye, San Jose, CA (US); DanJing Huang, San Jose, CA (US); Bin-Da Chan, San Jose, CA (US)

(73) Assignee: ASML Netherlands B.V., Veldhoven (NL)

(*) Notice: Subject to any disclaimer, the term of this patent is extended or adjusted under 35 U.S.C. 154(b) by 624 days.

(21) Appl. No.: 17/276,124

(22) PCT Filed: Aug. 26, 2019

(86) PCT No.: PCT/EP2019/072678
§ 371 (c)(1),
(2) Date: Mar. 13, 2021

(87) PCT Pub. No.: WO2020/052943
PCT Pub. Date: Mar. 19, 2020

(65) Prior Publication Data
US 2022/0042935 A1 Feb. 10, 2022

Related U.S. Application Data

(60) Provisional application No. 62/730,972, filed on Sep. 13, 2018.

(51) Int. Cl.
*G01N 23/2251* (2018.01)
*G01J 1/42* (2006.01)
*G06T 7/00* (2017.01)

(52) U.S. Cl.
CPC ........ *G01N 23/2251* (2013.01); *G01J 1/4257* (2013.01); *G06T 7/001* (2013.01);
(Continued)

(58) Field of Classification Search
None
See application file for complete search history.

(56) References Cited

U.S. PATENT DOCUMENTS

| 7,084,406 B2 | 8/2006 | Knippelmeyer |
| 9,536,697 B2 | 1/2017 | Wang et al. |

(Continued)

FOREIGN PATENT DOCUMENTS

| JP | 2000 048722 A | 2/2000 |
| JP | 2000 234916 A | 8/2000 |

(Continued)

OTHER PUBLICATIONS

Shibuya, Hisae et al.; "Beam Profile Measurement System for Focus Evaluation of CRTs," IDW, CRTP-4, London, UK, Jan. 1, 2000; XP007015050; pp. 573-576 (4 pgs.).

(Continued)

*Primary Examiner* — David A Vanore
(74) *Attorney, Agent, or Firm* — Finnegan, Henderson, Farabow, Garrett & Dunner, LLP

(57) ABSTRACT

A system and a method for monitoring a beam in an inspection system are provided. The system includes an image sensor configured to collect a sequence of images of a beam spot of a beam formed on a surface, each image of the sequence of images having been collected at a different exposure time of the image sensor, and a controller configured to combine the sequence of images to obtain a beam profile of the beam.

20 Claims, 14 Drawing Sheets

(52) U.S. Cl.
CPC ... *G01N 2223/07* (2013.01); *G01N 2223/418* (2013.01); *G01N 2223/507* (2013.01); *G01N 2223/6116* (2013.01); *G06T 2207/10016* (2013.01); *G06T 2207/10144* (2013.01); *G06T 2207/30108* (2013.01)

(56) References Cited

U.S. PATENT DOCUMENTS

| | | | |
|---|---|---|---|
| 9,966,227 B2 | 5/2018 | Hatakeyama et al. | |
| 2009/0135419 A1 | 5/2009 | Finarov | |
| 2011/0155905 A1 | 6/2011 | Hatakeyama et al. | |
| 2017/0256465 A1* | 9/2017 | Van Leest | G01N 21/9501 |
| 2019/0049859 A1* | 2/2019 | Tsiatmas | G03F 7/7065 |
| 2019/0155173 A1* | 5/2019 | Tsiatmas | G06T 7/0006 |

FOREIGN PATENT DOCUMENTS

| | | | |
|---|---|---|---|
| JP | 2016-127023 A | 7/2016 | |
| WO | WO 2019/063531 A1 | 4/2019 | |
| WO | WO-2020052943 A1 * | 3/2020 | G01J 1/4228 |

OTHER PUBLICATIONS

Mitchell, T.J. et al.; "Quantitative high dynamic range beam profiling for fluorescence microscopy," Review of Scientific Instruments, AIP, Melville, NY, US, vol. 85, No. 10; Oct. 29, 2014, XP012191378, ISSN: 0034-6748, DOI: 10.1063/1.4899208 (6 pgs.).

López-Alonso, José Manuel et al.; "Noise in imaging systems: Fixe pattern noise, electronic and interference noise," SPIE, P.O. Box 10, Bellingham, WA; XP040186990; 2004 (10 pgs.).

International Search Report issued by the International Searching Authority in related International Application No. PCT/EP2019/072678, mailed Jan. 30, 2020 (6 pgs.).

Office Action of the Intellectual Property Office of Taiwan issued in the Taiwanese Patent Application No. 108131789, mailed Apr. 29, 2021 (12 pgs.).

\* cited by examiner image taken at exposure time t1 image taken at exposure time t2 image taken at exposure time t3 partial beam profile at high-level partial beam profile at mid-level partial beam profile at low-level Whole beam distribution

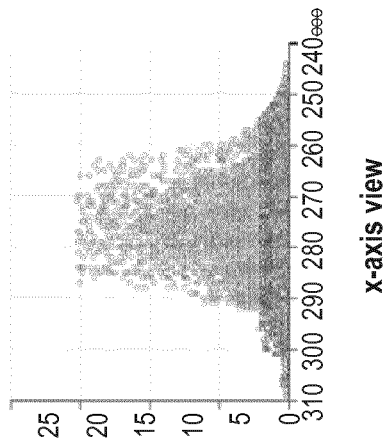
FIG. 11G
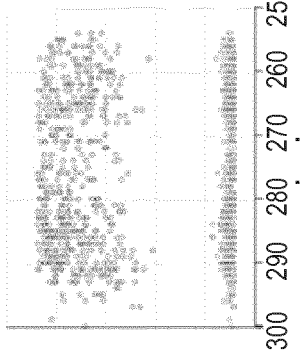
FIG. 11E
FIG. 11F
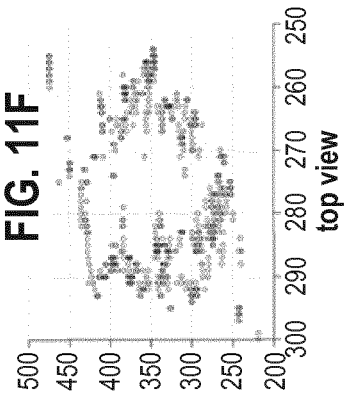
Overlap part:
Get multiple factor
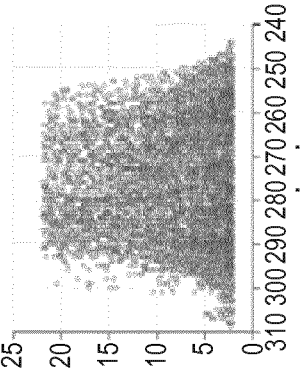
FIG. 11C
FIG. 11D
○ exposure time t1
○ exposure time t2
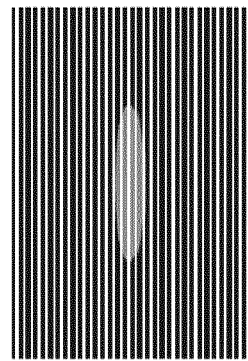
FIG. 11A
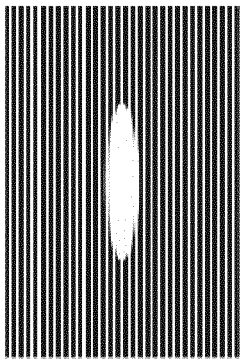
FIG. 11B

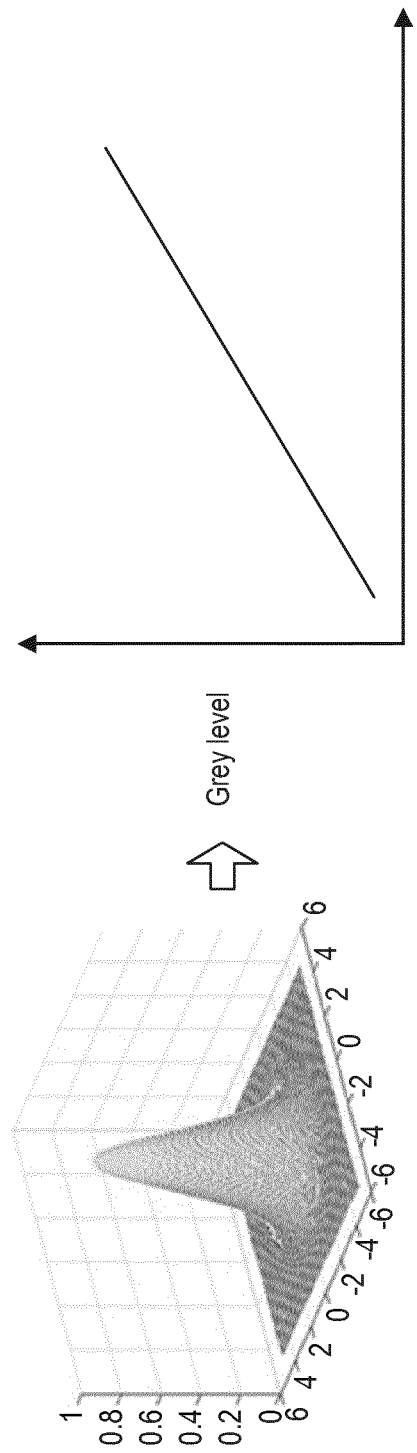
FIG. 13A
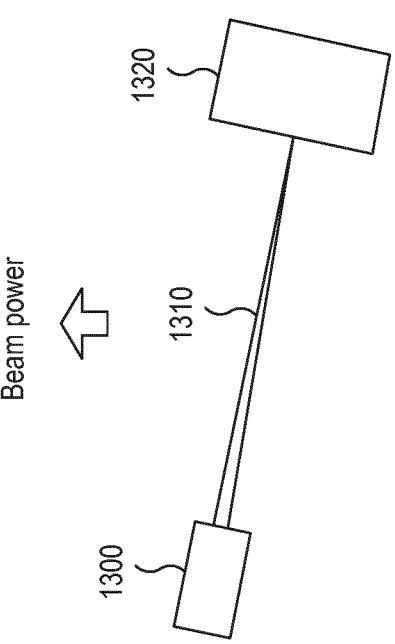
FIG. 13B
FIG. 13C

METHOD AND APPARATUS FOR MONITORING BEAM PROFILE AND POWER

CROSS-REFERENCE TO RELATED APPLICATIONS

This application claims priority to International Application No. PCT/EP2019/072678, filed Aug. 26, 2019, and published as WO 2020/052943 A1, which claims priority of U.S. application 62/730,972 which was filed on Sep. 13, 2018. The contents of these applications are incorporated herein by reference in their entireties.

TECHNICAL FIELD

The present disclosure generally relates to the field of charged particle beam systems and, more particularly, to a method and an apparatus for monitoring beam profile and beam power of a laser beam used in a charged particle beam system.

BACKGROUND

In manufacturing processes of integrated circuits (ICs), unfinished or finished circuit components are inspected to ensure that they are manufactured according to design and are free of defects. An inspection system utilizing an optical microscope typically has resolution down to a few hundred nanometers; and the resolution is limited by the wavelength of light. As the physical sizes of IC components continue to reduce down to sub-100 or even sub-10 nanometers, inspection systems capable of higher resolution than those utilizing optical microscopes are needed.

A charged particle (e.g., electron) beam microscope, such as a scanning electron microscope (SEM) or a transmission electron microscope (TEM), capable of resolution down to less than a nanometer, serves as a practicable tool for inspecting IC components having a feature size that is sub-100 nanometers. With a SEM, electrons of a single primary electron beam, or electrons of a plurality of primary electron beams, can be focused at locations of interest of a wafer under inspection. The primary electrons interact with the wafer and may be backscattered or may cause the wafer to emit secondary electrons. The intensity of the electron beams comprising the backscattered electrons and the secondary electrons may vary based on the properties of the internal and external structures of the wafer, and thereby may indicate whether the wafer has defects.

SUMMARY

Embodiments consistent with the present disclosure include systems, methods, and non-transitory computer-readable mediums for monitoring a beam in an inspection system. The system includes an image sensor collect a sequence of images of a beam spot of a beam formed on a surface. Each image of the sequence of images has been collected at a different exposure time. of the image sensor. The system also includes a controller configured to combine the sequence of images to obtain a beam profile of the beam.

Embodiments consistent with the present disclosure include systems, methods, and non-transitory computer-readable mediums for monitoring a beam in an inspection system. The system includes an image sensor configured to collect an image of a beam spot of a beam formed on a surface, and a controller configured to transform coordinates of the image based on positions of the beam and the image sensor with respect to the beam spot and a magnification factor of an optical system arranged between the image sensor and the surface.

Embodiments consistent with the present disclosure include systems, methods, and non-transitory computer-readable mediums for monitoring a beam in an inspection system. The system includes an image sensor configured to collect a plurality of images of a beam spot of a beam formed at different locations on a surface, and a controller configured to generate an averaged image based on the plurality of images.

Embodiments consistent with the present disclosure include systems, methods, and non-transitory computer-readable mediums for monitoring a beam in an inspection system. The system includes an image sensor configured to collect an image of a beam spot of a beam formed on a surface, and a controller configured to obtain a beam profile of the beam based on the image, obtain a total grey level of the beam spot based on the beam profile, and determine a power of the beam based on a predetermined relationship between the total grey level and the power.

Additional objects and advantages of the disclosed embodiments will be set forth in part in the following description, and in part will be apparent from the description, or may be learned by practice of the embodiments. The objects and advantages of the disclosed embodiments may be realized and attained by the elements and combinations set forth in the claims.

It is to be understood that both the foregoing general description and the following detailed description are exemplary and explanatory only and are not restrictive of the disclosed embodiments, as claimed.

BRIEF DESCRIPTION OF THE DRAWINGS

FIGS. 11A-11G illustrate an exemplary method of determining a grey level magnification factor, consistent with embodiments of the present disclosure.

FIG. 13A is an example of a 3D beam profile, consistent with embodiments of the present disclosure.

FIG. 13B schematically illustrates a method of measuring a beam power by a power meter, consistent with some embodiments of the present disclosure.

FIG. 13C is a diagram of an exemplary relationship between beam power and total grey level of a beam spot, consistent with some embodiments of the present disclosure.

DESCRIPTION OF THE EMBODIMENTS

Figure 1:
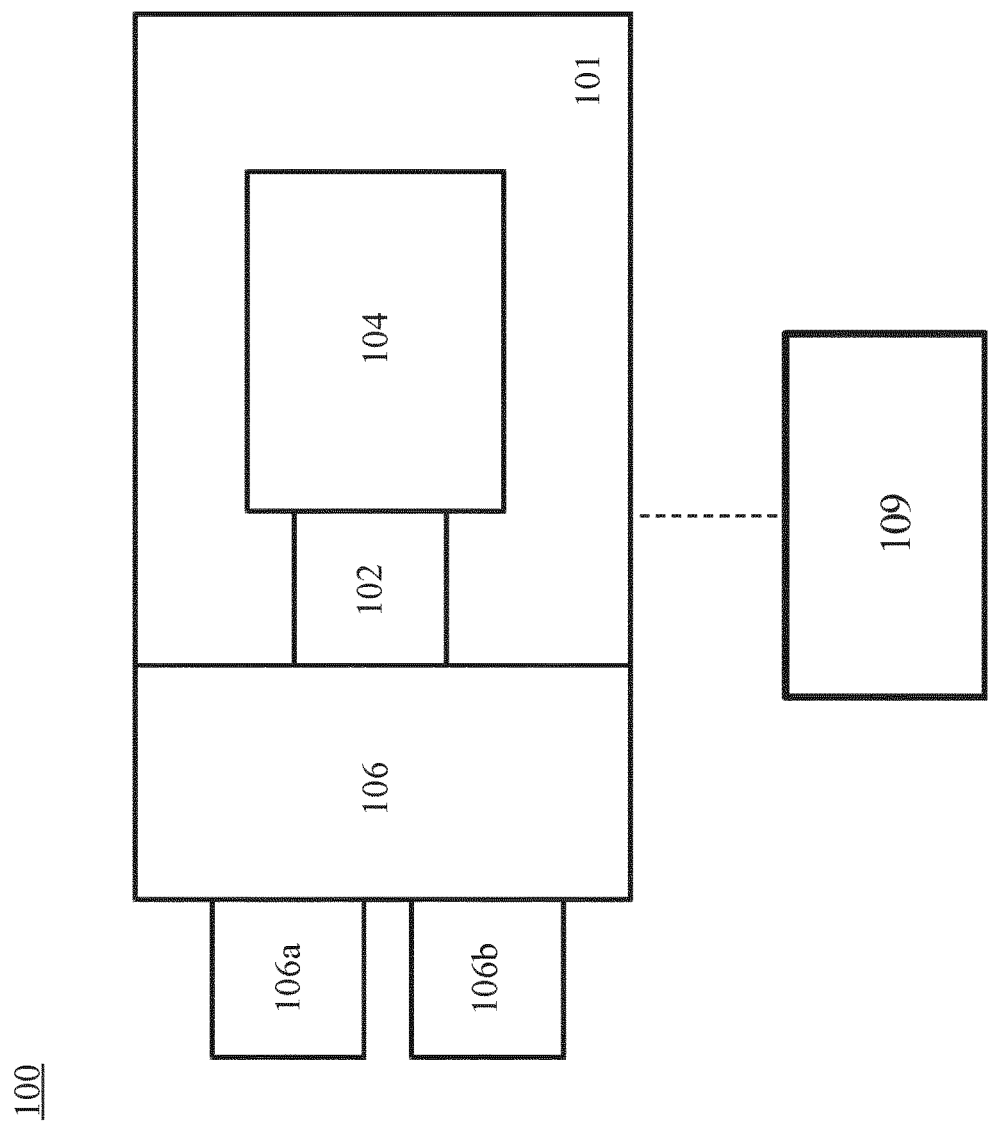
FIG. 1 illustrates an exemplary electron beam inspection (EBI) system 100, consistent with embodiments of the present disclosure.

Reference will now be made in detail to exemplary embodiments, examples of which are illustrated in the accompanying drawings. The following description refers to the accompanying drawings in which the same numbers in different drawings represent the same or similar elements unless otherwise represented. The implementations set forth in the following description of exemplary embodiments do not represent all implementations consistent with the invention. Instead, they are merely examples of apparatuses and methods consistent with aspects related to the invention as recited in the appended claims.

The enhanced computing power of electronic devices, while reducing the physical size of the devices, can be accomplished by significantly increasing the packing density of circuit components such as, transistors, capacitors, diodes, etc. on an IC chip. For example, in a smart phone, an IC chip (which is the size of a thumbnail) may include over 2 billion transistors, the size of each transistor being less than 1/1000th of a human hair. Not surprisingly, semiconductor IC manufacturing is a complex process, with hundreds of individual steps. Errors in even one step have the potential to dramatically affect the functioning of the final product. Even one "killer defect" can cause device failure. The goal of the manufacturing process is to improve the overall yield of the process. For example, for a 50-step process to get 75% yield, each individual step must have a yield greater than 99.4%, and if the individual step yield is 95%, the overall process yield drops to 7%.

Defects may be generated during various stages of semiconductor processing. For the reason stated above, it is important to find defects accurately and efficiently as early as possible. A charged particle (e.g., electron) beam microscope, such as a scanning electron microscope (SEM), is a useful tool for inspecting semiconductor wafer surfaces to detect defects. During operation, the charged particle beam microscope scans a primary charged-particle beam, such as an electron beam (e-beam), over a semiconductor wafer held on a stage, and generates an image of the wafer surface by detecting a secondary charged-particle beam reflected from the wafer surface. When the charged-particle beam scans the wafer, charges may be accumulated on the wafer due to large beam current, which may negatively affect the quality of the image. To regulate the accumulated charges on the wafer, an Advanced Charge Controller (ACC) module is employed to illuminate a light beam, such as a laser beam, on the wafer, so as to control the accumulated charges due to photoconductivity and/or photoelectric effect. It is thus important to monitor the power and quality of the light beam, so as to effectively control the accumulated charges.

Conventionally, the power and quality of a light beam are monitored by a power meter and a beam profiler. However, during operation of a charged particle beam microscope, the microscope, the ACC module that illuminates the light beam, and the stage that holds the semiconductor wafer are disposed in a vacuum chamber. Due to the limited space inside the vacuum chamber, the power meter and the beam profiler cannot be disposed in the vacuum chamber. As a result, the power meter and the beam profiler cannot be used to monitor power and quality of the light beam during the operation of a charged particle beam microscope.

To monitor the light beam in a limited space in a vacuum chamber, the disclosed system uses an image sensor, which is already included in the charged particle beam microscope for other purposes (e.g., observing wafer surface, etc.), to monitor the power and profile of the light beam emitted from the ACC module.

Due to the high intensity of the light beam (e.g., laser beam), an image sensor may not have a sufficiently large dynamic range to capture the complete beam profile of the light beam. In order to solve this problem, the disclosed systems can configure the image sensor to collect during different exposure times a sequence of images of a beam spot formed on the semiconductor wafer, resulting in a set of images capturing the complete beam profile. As a result, even if the image sensor has a dynamic range that is not sufficiently large to capture the complete beam profile of the light beam, the controller can still obtain the complete beam profile based on the partial beam files obtained from the sequence of images.

Due to limited space inside the vacuum chamber of the microscope, the image sensor may not be able to collect images from a top side of a semiconductor wafer. Thus, the shape of the beam spot in the image taken by the image sensor may not be a real beam projection on the wafer. To solve this problem, the disclosed systems can transform coordinates of an image based on positions of the light and the image sensor with respect to the beam spot and a magnification factor of an optical system arranged between the image sensor and the wafer surface. As a result, a projection of the light beam on the surface may be obtained, and an interaction between the light beam and the surface can be accurately evaluated.

In some instances, the ACC module, the beam spot, and the image sensor may not be in the same plane. Therefore, the light beam cannot be directly reflected into the image sensor. In order to solve this problem, the disclosed system can emit the light beam onto a relatively rough surface, such as a corner of a wafer stage, and the image sensor may be configured to collect light scattered or diffracted from this rough surface. In this case, due to the rough surface, a beam profile obtained from the captured image is also rough. In order to solve this problem, the disclosed systems can configure the image sensor to capture a plurality of images of the beam spot formed at different locations on the surface. Using these plurality of images, the disclosed systems can generate an averaged image based on the plurality of images, and use the averaged image as the collected image for the at least one exposure time. As a result, the beam profile obtained based on the averaged image may be smooth, even if the surface on which the beam spot is formed is relatively rough.

In some instances, the disclosed system can emit the light beam onto a relatively smooth and mirror-like surface, and the light beam can be directly reflected into the image sensor. In this case, a single beam spot image captured by the image sensor can be used to obtain a beam profile, and it is not necessary to generate an averaged image based on a plurality of images of the beam spot formed at different locations on the surface.

Moreover, the disclosed systems can obtain a total grey level of the beam spot, and determine a power of the light beam based on a predetermined relationship between the total grey level and the power. The disclosed systems can control a power of the ACC module based on the determined power of the light beam, in order to obtain a desired power of the light beam.

FIG. 1 illustrates an exemplary electron beam inspection (EBI) system 100 consistent with embodiments of the present disclosure. While this and other examples refer to an electron beam system, it is appreciated that the techniques disclosed herein are applicable to systems other than electron beam systems, such as an ellipsometer, a velocimeter, a CO2 laser (e.g., for machining), non-electron beam systems where a laser needs to be monitored but the space is limited, among others. As shown in FIG. 1, EBI system 100 includes a main chamber 101, a load/lock chamber 102, an electron beam tool 104, and an equipment front end module (EFEM) 106. Electron beam tool 104 is located within main chamber 101. EFEM 106 includes a first loading port 106a and a second loading port 106b. EFEM 106 may include additional loading port(s). First loading port 106a and second loading port 106b receive wafer front opening unified pods (FOUPs) that contain wafers (e.g., semiconductor wafers or wafers made of other material(s)) or samples to be inspected (wafers and samples may be collectively referred to as "wafers" herein).

One or more robotic arms (not shown) in EFEM 106 may transport the wafers to load/lock chamber 102. Load/lock chamber 102 is connected to a load/lock vacuum pump system (not shown) which removes gas molecules in load/lock chamber 102 to reach a first pressure below the atmospheric pressure. After reaching the first pressure, one or more robotic arms (not shown) may transport the wafer from load/lock chamber 102 to main chamber 101. Main chamber 101 is connected to a main chamber vacuum pump system (not shown) which removes gas molecules in main chamber 101 to reach a second pressure below the first pressure. After reaching the second pressure, the wafer is subject to inspection by electron beam tool 104. Electron beam tool 104 may be a single-beam system or a multi-beam system. A controller 109 is electronically connected to electron beam tool 104. Controller 109 may be a computer configured to execute various controls of EBI system 100. While controller 109 is shown in FIG. 1 as being outside of the structure that includes main chamber 101, load/lock chamber 102, and EFEM 106, it is appreciated that controller 109 can part of the structure.

Figure 2A:
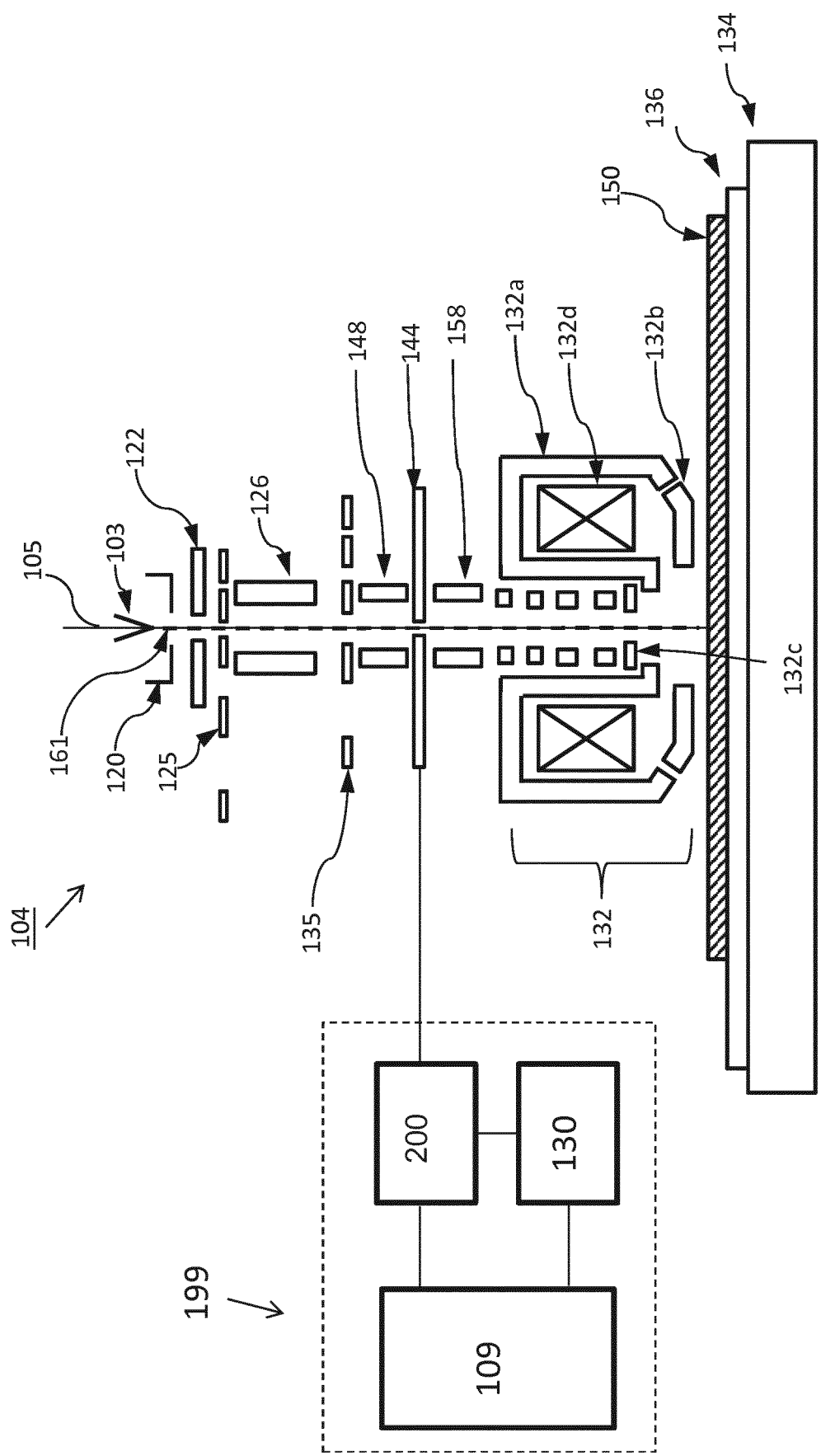
FIG. 2A and FIG. 2B are schematic diagrams illustrating exemplary electron beam tools, consistent with embodiments of the present disclosure that may be a part of the exemplary electron beam inspection system of FIG. 1

FIG. 2A illustrates a charged particle beam apparatus in which an inspection system may comprise a single primary beam that may be configured to generate a secondary beam. A detector may be placed along an optical axis 105, as in the embodiment shown in FIG. 2A. In some embodiments, a detector may be arranged off axis.

As shown in FIG. 2A, an electron beam tool 104 may include a wafer holder 136 supported by motorized stage 134 to hold a wafer 150 to be inspected. Electron beam tool 104 includes an electron emitter, which may comprise a cathode 103, an anode 120, and a gun aperture 122. Electron beam tool 104 further includes a beam limit aperture 125, a condenser lens 126, a column aperture 135, an objective lens assembly 132, and an electron detector 144. Objective lens assembly 132, in some embodiments, may be a modified swing objective retarding immersion lens (SORIL), which includes a pole piece 132a, a control electrode 132b, a deflector 132c, and an exciting coil 132d. In an imaging process, an electron beam 161 emanating from the tip of cathode 103 may be accelerated by anode 120 voltage, pass through gun aperture 122, beam limit aperture 125, condenser lens 126, and focused into a probe spot by the modified SORIL lens and then impinge onto the surface of wafer 150. The probe spot may be scanned across the surface of wafer 150 by a deflector, such as deflector 132c or other deflectors in the SORIL lens. Secondary electrons emanated from the wafer surface may be collected by detector 144 to form an image of an area of interest on wafer 150.

There may also be provided an image processing system 199 that includes an image acquirer 200, a storage 130, and controller 109. Image acquirer 200 may comprise one or more processors. For example, image acquirer 200 may comprise a computer, server, mainframe host, terminals, personal computer, any kind of mobile computing devices, and the like, or a combination thereof. Image acquirer 200 may connect with detector 144 of electron beam tool 104 through a medium such as an electrical conductor, optical fiber cable, portable storage media, IR, Bluetooth, internet, wireless network, wireless radio, or a combination thereof. Image acquirer 200 may receive a signal from detector 144 and may construct an image. Image acquirer 200 may thus acquire images of wafer 150. Image acquirer 200 may also perform various post-processing functions, such as generating contours, superimposing indicators on an acquired image, and the like. Image acquirer 200 may be configured to perform adjustments of brightness and contrast, etc. of acquired images. Storage 130 may be a storage medium such as a hard disk, random access memory (RAM), cloud storage, other types of computer readable memory, and the like. Storage 130 may be coupled with image acquirer 200 and may be used for saving scanned raw image data as original images, and post-processed images. Image acquirer 200 and storage 130 may be connected to controller 109. In some embodiments, image acquirer 200, storage 130, and controller 109 may be integrated together as one control unit.

In some embodiments, image acquirer 200 may acquire one or more images of a sample based on an imaging signal received from detector 144. An imaging signal may correspond to a scanning operation for conducting charged particle imaging. An acquired image may be a single image comprising a plurality of imaging areas that may contain various features of wafer 150. The single image may be stored in storage 130. Imaging may be performed on the basis of imaging frames.

The condenser and illumination optics of the electron beam tool may comprise or be supplemented by electromagnetic quadrupole electron lenses. For example, as shown in FIG. 2A, the electron beam tool 104 may comprise a first quadrupole lens 148 and a second quadrupole lens 158. In some embodiments, the quadrupole lenses are used for controlling the electron beam. For example, first quadrupole lens 148 can be controlled to adjust the beam current and second quadrupole lens 158 can be controlled to adjust the beam spot size and beam shape.

Although FIG. 2A shows electron beam tool 104 as a single-beam inspection tool that may use only one primary electron beam to scan one location of wafer 150 at a time, embodiments of the present disclosure are not so limited. For example, electron beam tool 104 may also be a multi-beam inspection tool that employs multiple primary electron beamlets to simultaneously scan multiple locations on wafer 150.

Figure 2B:
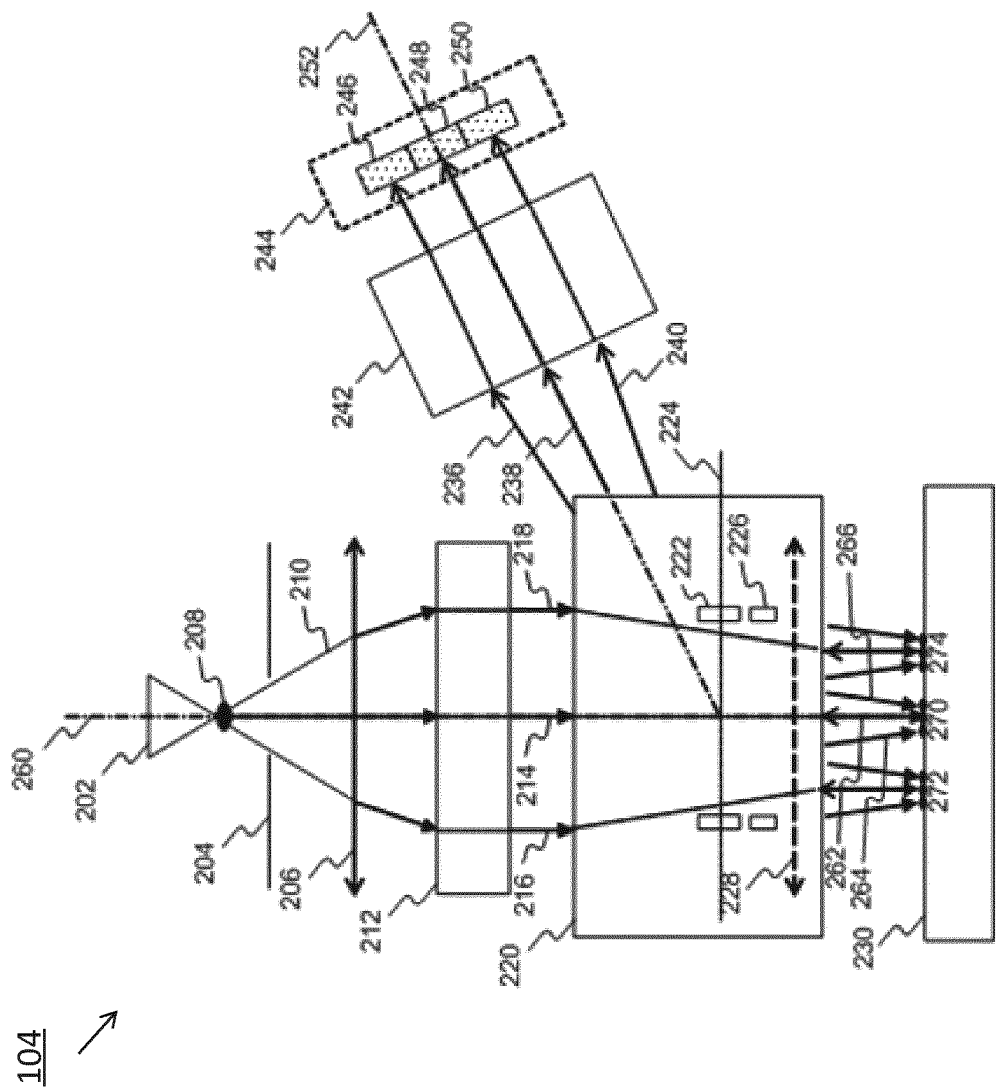

For example, reference is now made to FIG. 2B, which illustrates another embodiment of electron beam tool 104. Electron beam tool 104 (also referred to herein as apparatus 104) may comprise an electron source 202, a gun aperture 204, a condenser lens 206, a primary electron beam 210 emitted from electron source 202, a source conversion unit 212, a plurality of beamlets 214, 216, and 218 of primary electron beam 210, a primary projection optical system 220, a wafer stage (not shown in FIG. 2B), multiple secondary electron beams 236, 238, and 240, a secondary optical system 242, and an electron detection device 244. A controller, image processing system, and the like may be coupled to electron detection device 244. Primary projection optical system 220 may comprise a beam separator 222, deflection scanning unit 226, and objective lens 228. Electron detection device 244 may comprise detection sub-regions 246, 248, and 250.

Electron source 202, gun aperture 204, condenser lens 206, source conversion unit 212, beam separator 222, deflection scanning unit 226, and objective lens 228 may be aligned with a primary optical axis 260 of apparatus 104. Secondary optical system 242 and electron detection device 244 may be aligned with a secondary optical axis 252 of apparatus 104.

Electron source 202 may comprise a cathode, an extractor or an anode, wherein primary electrons can be emitted from the cathode and extracted or accelerated to form a primary electron beam 210 with a crossover (virtual or real) 208. Primary electron beam 210 can be visualized as being emitted from crossover 208. Gun aperture 204 may block off peripheral electrons of primary electron beam 210 to reduce size of probe spots 270, 272, and 274.

Source conversion unit 212 may comprise an array of image-forming elements (not shown in FIG. 2B) and an array of beam-limit apertures (not shown in FIG. 2B). An example of source conversion unit 212 may be found in U.S. Pat. No. 9,691,586; U.S. Publication No. 2017/0025243; and International Application No. PCT/EP2017/084429, all of which are incorporated by reference in their entireties. The array of image-forming elements may comprise an array of micro-deflectors or micro-lenses. The array of image-forming elements may form a plurality of parallel images (virtual or real) of crossover 208 with a plurality of beamlets 214, 216, and 218 of primary electron beam 210. The array of beam-limit apertures may limit the plurality of beamlets 214, 216, and 218.

Condenser lens 206 may focus primary electron beam 210. The electric currents of beamlets 214, 216, and 218 downstream of source conversion unit 212 may be varied by adjusting the focusing power of condenser lens 206 or by changing the radial sizes of the corresponding beam-limit apertures within the array of beam-limit apertures. Condenser lens 206 may be a moveable condenser lens that may be configured so that the position of its first principle plane is movable. The movable condenser lens may be configured to be magnetic, which may result in off-axis beamlets 216 and 218 landing on the beamlet-limit apertures with rotation angles. The rotation angles change with the focusing power and the position of the first principal plane of the movable condenser lens. In some embodiments, the moveable condenser lens may be a moveable anti-rotation condenser lens, which involves an anti-rotation lens with a movable first principal plane. Moveable condenser lens is further described in U.S. Publication No. 2017/0025241, which is incorporated by reference in its entirety.

Objective lens 228 may focus beamlets 214, 216, and 218 onto a wafer 230 for inspection and may form a plurality of probe spots 270, 272, and 274 on the surface of wafer 230.

Beam separator 222 may be a beam separator of Wien filter type generating an electrostatic dipole field and a magnetic dipole field. In some embodiments, if they are applied, the force exerted by electrostatic dipole field on an electron of beamlets 214, 216, and 218 may be equal in magnitude and opposite in direction to the force exerted on the electron by magnetic dipole field when the electrons of the beam are traveling at a particular velocity. Beamlets 214, 216, and 218 can therefore pass straight through beam separator 222 with zero deflection angle. However, the total dispersion of beamlets 214, 216, and 218 generated by beam separator 222 may also be non-zero such as when the electrons of the beam are traveling at a velocity other than the particular velocity. Beam separator 222 may separate secondary electron beams 236, 238, and 240 from beamlets 214, 216, and 218 and direct secondary electron beams 236, 238, and 240 towards secondary optical system 242.

Deflection scanning unit 226 may deflect beamlets 214, 216, and 218 to scan probe spots 270, 272, and 274 over a surface area of wafer 230. In response to incidence of beamlets 214, 216, and 218 at probe spots 270, 272, and 274, secondary electron beams 236, 238, and 240 may be emitted from wafer 230. Secondary electron beams 236, 238, and 240 may comprise electrons with a distribution of energies including secondary electrons and backscattered electrons. Secondary optical system 242 may focus secondary electron beams 236, 238, and 240 onto detection sub-regions 246, 248, and 250 of electron detection device 244. Detection sub-regions 246, 248, and 250 may be configured to detect corresponding secondary electron beams 236, 238, and 240 and generate corresponding signals used to reconstruct an image of surface area of wafer 230.

Figure 3A:
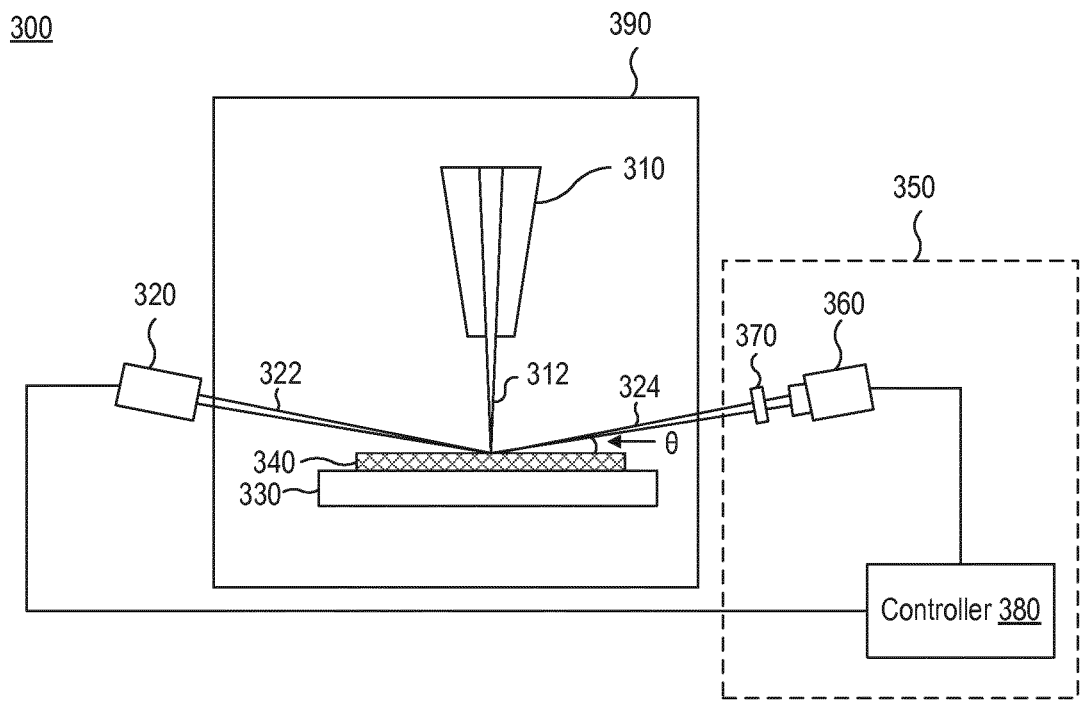
FIG. 3A is a side view of an inspection system, consistent with embodiments of the present disclosure.

FIG. 3A is a side view of an inspection system 300 consistent with embodiments of the present disclosure. As shown in FIG. 3A, inspection system 300 includes an electron beam tool 310, an advanced charge controller (ACC) module 320, a stage 330 on which a sample to be inspected (e.g., a wafer 340) is disposed, and a beam monitoring system 350. Electron beam tool 310 may emit a primary electron beam 312 onto an area of interest on wafer 340, and collect secondary electrons emanated from the wafer surface to form an image of the area of interest on wafer 340. ACC module 320 may include an ACC emitter that emits a light beam 322 (e.g., laser beam) onto wafer 340 and form a beam spot of light beam 322 on the wafer surface. When primary electron beam 312 irradiates the area of interest on wafer 340, charges may be accumulated due to a large beam current. Light beam 322 emitted from ACC module 320 may be configured to regulate the accumulated charges due to photoconductivity or photoelectric effect, or a combination of photoconductivity and photoelectric effect. It is important to monitor the power and quality of light beam 322 emitted from ACC module 320 to effectively regulate the accumulated charges by light beam 322.

Conventionally, the power and quality of a light beam are monitored by a power meter and a beam profiler. However, an inspection system 300 may not be provided with a power meter or a beam profiler. As a result, power and quality of the light beam may not be monitored in situ, i.e., during the operation of inspection system 300.

According to embodiments of the present disclosure, beam monitoring system 350 may be included in inspection system 300 to monitor the power and profile of light beam 322 emitted from ACC module 320. Beam monitoring system 350 may include an image sensor 360, an optical system 370 disposed between wafer 340 and image sensor 360, and a controller 380. Optical system 370 may include one or more optical lenses that are configured to focus a secondary beam 324 onto image sensor 360. Secondary beam 324 may include light beam scattered from the wafer surface, or light beam diffracted from the wafer surface, or a combination of light beam scattered from the wafer surface and light beam diffracted from the wafer surface. Image sensor 360 may be a Charge-Coupled Device (CCD) camera or a Complementary Metal-Oxide-Semiconductor (CMOS) sensor that detects secondary beam 324 to form an image of secondary beam 324. Controller 380 may be a computer configured to receive the image of secondary beam 324 from image sensor 360 and, based on the image of secondary beam 324, obtain a beam profile and beam power of light beam 322 emitted from ACC module 320. In addition, controller 380 may be configured to control ACC module 320 based on the beam profile and beam power of light beam 322. For example, based on the beam power of light beam 322, controller 380 may automatically adjust a working current of the ACC emitter included in ACC module 320 to keep an output power of the ACC emitter at a target power or to remain stable. Meanwhile, based on the beam profile of light beam 322, controller 380 may adjust a beam shaper included in ACC module 320 to obtain a desired shape of the beam profile or a desired power distribution. Moreover, based on the beam power of light beam 322, controller 380 may be configured to monitor a location of the beam spot formed by light beam 322 on the wafer surface. In case of misalignment, controller 380 may be configured to re-align the beam spot to a field of view of electron beam tool 310. That is, controller 380 may control the ACC emitter to emit light beam 322 to a position on wafer 340 that is irradiated by primary electron beam 312.

Figure 3B:
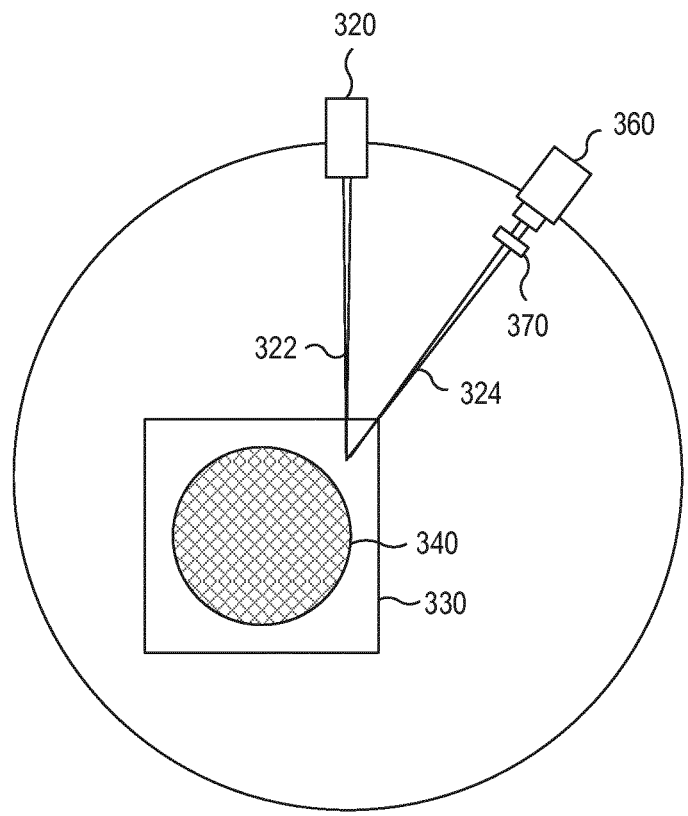
FIG. 3B is a top view of the inspection system of FIG. 3A, consistent with embodiments of the present disclosure.

FIG. 3B is a top view of inspection system 300 during operation of beam monitoring system 350, consistent with embodiments of the present disclosure. To simplify the illustration, electron beam tool 310 and controller 380 are omitted from FIG. 3B. As shown in FIG. 3B, in inspection system 300, light beam 322 from ACC module 320 may be aligned with the field of view of electron beam tool 310. Meanwhile, the field of view of image sensor 360 may also be aligned with the field of view of electron beam tool 310. At the beginning of a beam monitoring process, the field of view of electron beam tool 310 may be moved to a corner portion of stage 330 on which wafer 340 is not disposed. The corner portion of stage 330 may have a relatively rough surface, and secondary beam 324 may be scattered or diffracted from this rough surface. In this way, image sensor 360 may capture images of the beam spot formed on the corner portion of stage 330. In some alternative embodiments, a special designed sample surface may be used to collect the light beam signal emitted from ACC module 320. Still alternatively, the wafer surface or a smooth surface may also be used to collect the light beam signal emitted from ACC module 320.

In some embodiments, such as the embodiment illustrated in FIG. 3A, ACC module 320 and image sensor 360 are disposed outside of a vacuum chamber 390, in which electron beam tool 310 and wafer 340 are disposed. During operation of the inspection system 300, light beam 322 and secondary beam 324 may pass through one or more windows formed in vacuum chamber 390. In some alternative embodiments, at least one of ACC module 320 and image sensor 360 may be disposed inside of vacuum chamber 390.

In some embodiments, such as the embodiments illustrated in FIGS. 3A and 3B, image sensor 360 is not disposed directly on top of the beam spot formed by light beam 322 emitted from ACC module 320, and thus image sensor 360 may not capture the image of the beam spot from a top side of the beam spot. As a result, the shape of the beam spot in the image captured by image sensor 360 may not be the same as a projection of light beam 322 on the surface. Nonetheless, the projection ("Top View") of light beam 322 on a sample surface enables evaluating an interaction between light beam 322 and the sample (e.g., wafer 340). Therefore, according to embodiments of the present disclosure, controller 380 may be configured to transform the images of the beam spot (hereinafter referred to as "beam spot images") taken by image sensor 360, to obtain the projection of light beam 322 on the sample surface. The method performed by controller 380 is referred to as a coordinate transformation method.

Figure 4:
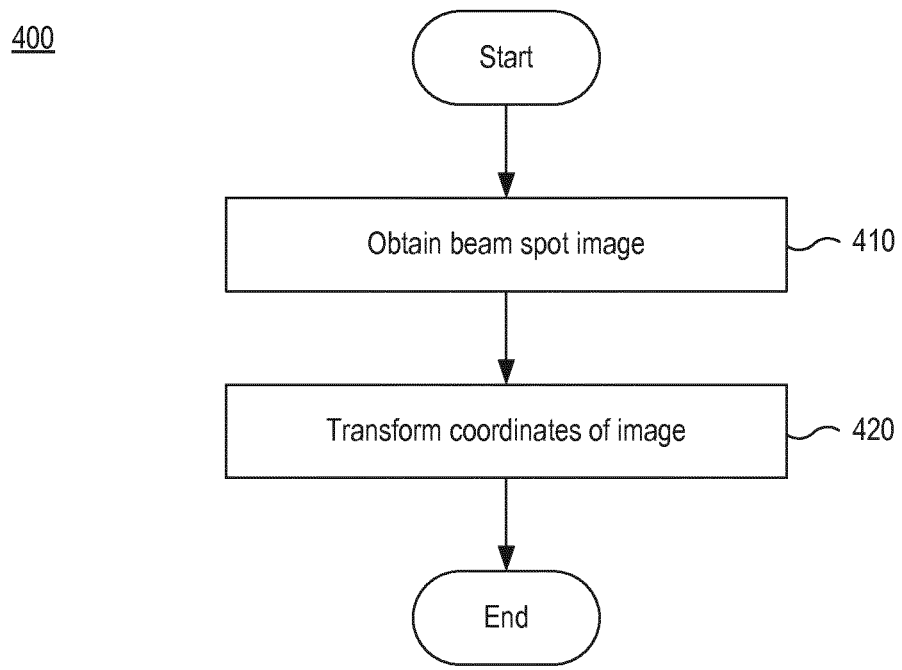
FIG. 4 is an exemplary flowchart of a process for transforming an image of a beam spot by using a coordinate transformation method, consistent with embodiments of the present disclosure.

FIG. 4 is an exemplary flowchart of a process 400 for transforming a beam spot image by using the coordinate transformation method, consistent with embodiments of the present disclosure. Process 400 may be performed by a controller, such as controller 380 illustrated in FIG. 3A.

Figure 5B:
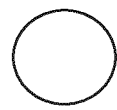
FIG. 5B is an exemplary image of a Top View of a beam spot formed on a sample surface, consistent with embodiments of the present disclosure.
Figure 5A:
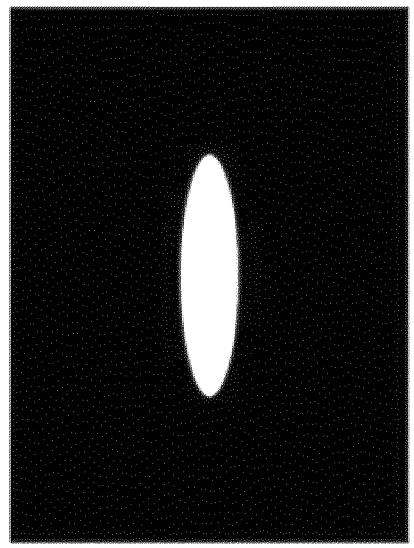
FIG. 5A is an exemplary image of a beam spot captured by an image sensor, consistent with embodiments of the present disclosure.

As shown in FIG. 4, at step 410, the controller may obtain a beam spot image formed on a sample surface and captured by an image sensor (e.g., image sensor 360 of FIG. 3A). FIG. 5A is an exemplary beams spot image captured by image sensor 360 disposed at a position illustrated in FIG. 3B. As shown in FIG. 5A, the shape of the beam spot at the center of the image is distorted.

At step 420, the controller may transform coordinates of the beam spot image to obtain a Top View of the beam spot formed on the sample surface. The coordinate transformation may be performed based on the positions and layouts of optical system 370, ACC module 320, and image sensor 360. For example, controller 380 may transform the coordinates of at least one pixel in the beam spot image based on the following equation:

$$\begin{cases} x' = \dfrac{x}{-m} \\ y' = \dfrac{y}{-m * \sin(\theta)} \end{cases}$$

where x' and y' are the cartesian coordinates on the wafer, x and y are the coordinates in the beam spot image captured by image sensor 360, m is the magnification of the optical system 370, and θ is the angle of image sensor 360 with respect to the sample surface, as illustrated in FIG. 3A. FIG. 5B is a Top View of a beam spot formed on a sample surface, which may be obtained by using the coordinate transformation method. As shown in FIG. 5B, after the coordinate transformation, the shape of the beam spot becomes less distorted.

Figure 6:
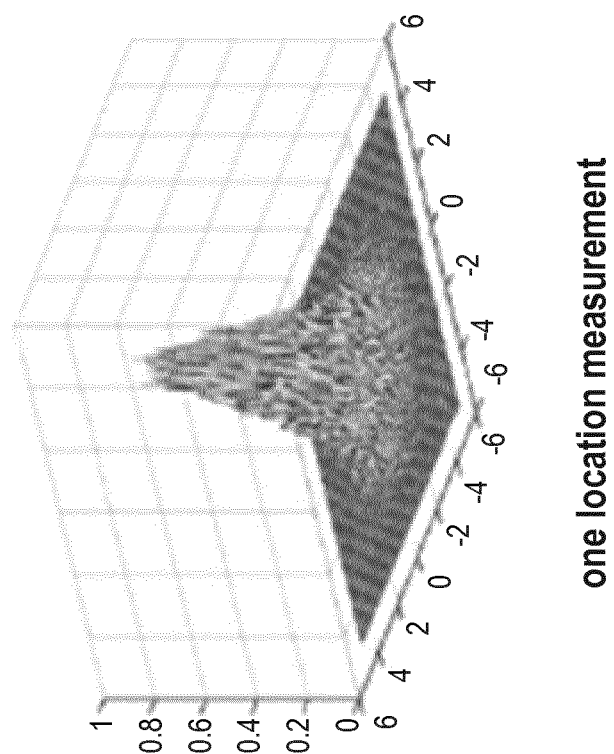
FIG. 6 is diagram of a 3D beam profile obtained based on an image of a beam spot formed on a relatively rough sample surface, consistent with embodiments of the present disclosure.

As described previously, in some embodiments, the images are taken on a relatively rough surface, such as the surface of stage 330 illustrated in FIG. 3B. The light from light beam 322 may be scattered or diffracted into image sensor 360 due to the rough surface. However, the scattering rates are not uniform across the beam spot, thereby leading to a distortion of a beam profile obtained by controller 380 based on the beam spot image captured by image sensor 360. FIG. 6 is a diagram of an exemplary 3D beam profile obtained based on a beam spot image formed on a relatively rough sample surface. In the diagram of FIG. 6, the horizontal axes represent positions on a sample surface, and the vertical axis represents the light intensity (e.g., grey level) of the beam spot at different positions. As shown in FIG. 6, the intensity of the beam spot formed on the relatively rough sample surface is not smoothly distributed.

To minimize or eliminate the influences of the rough surface on the beam profile, according to embodiments of the present disclosure, image sensor 360 may be configured to capture a plurality of beam spot images at different locations on a sample surface, and controller 380 may obtain an averaged image based on the plurality of images. This method is referred to as a locations average method.

Figure 7:
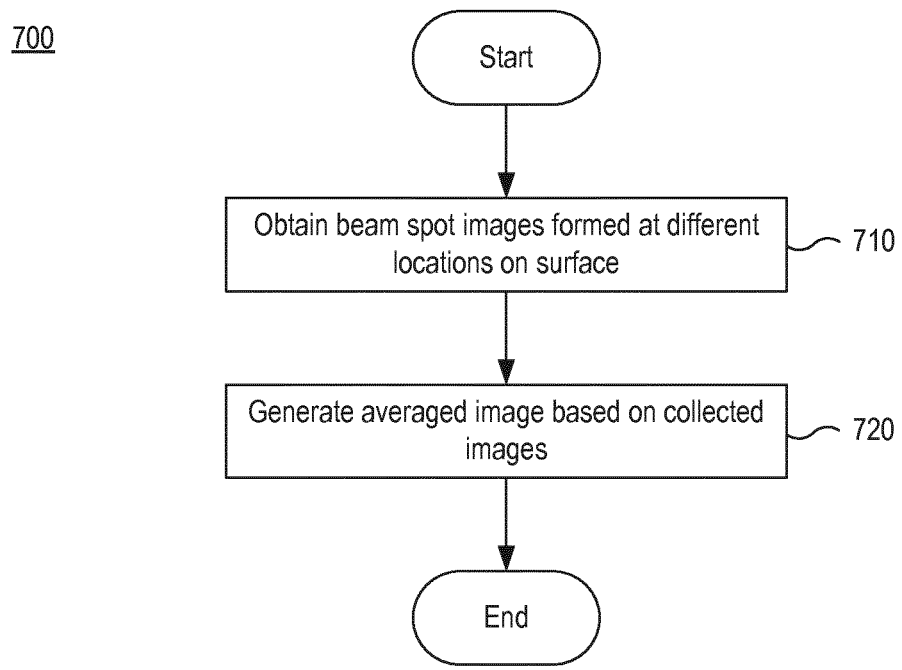
FIG. 7 is an exemplary flowchart of a process for obtaining an averaged beam spot image, consistent with embodiments of the disclosure.

FIG. 7 is an exemplary flowchart of a process 700 for obtaining an averaged beam spot image, consistent with embodiments of the disclosure. Process 700 may be performed by a controller, such as controller 380 illustrated in FIG. 3A.

Figures 8A, 8B:
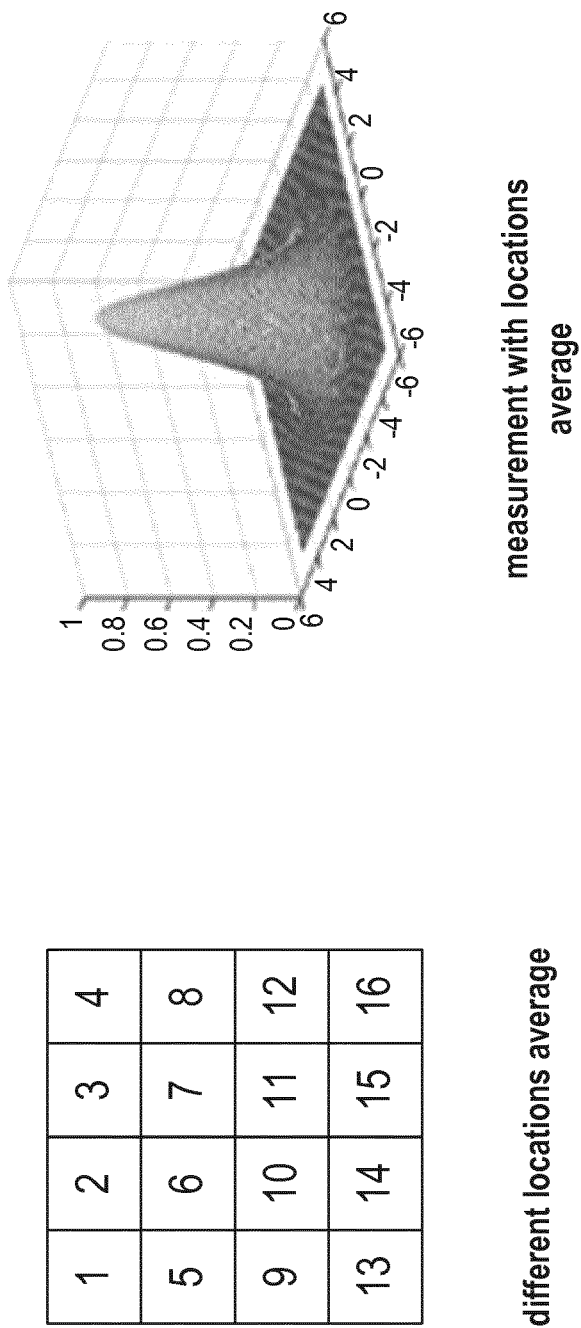
FIG. 8A is an example of different locations where beam spot images can be captured, consistent with embodiments of the present disclosure.
FIG. 8B is a diagram of a 3D beam profile obtained based on an averaged beam spot image, consistent with embodiments of the disclosure.

As shown in FIG. 7, at step 710, the controller may obtain a plurality of images of a beam spot formed at different locations on a sample surface. The locations selected for performing the locations average method may be, but not limited to, a 4×4 or 5×5 matrix. FIG. 8A is an example of a 4×4 matrix of locations 1 through 16 where beam spot images can be captured in the locations average method. For example, in the 4×4 matrix illustrated in FIG. 8A, the controller may first move a stage (e.g., stage 330 of FIG. 3A) to location 1 such that a light beam (e.g., light beam 322 of FIG. 3A) from an ACC module (e.g., ACC module 320 of FIG. 3A) forms a beam spot at location 1, and an image sensor (e.g., image sensor 360 of FIG. 3A) may capture an image of the beam spot formed at location 1. Then, the controller may move the stage to location 2 while keeping the positions of the ACC module and the image sensor unchanged, such that the light beam from the ACC module forms a beam spot at location 2, and the image sensor may capture an image of the beam spot formed at location 2. The process continues for locations 3 through 16 until the image sensor captures an image of a beam spot formed at location 16. As a result, the controller may obtain sixteen (16) beam spot images formed at locations 1 through 16, respectively.

Referring back to FIG. 7, at step 720, the controller may generate an averaged image based on the plurality of images. In the example of the 4×4 matrix illustrated in FIG. 8A, the controller may generate an averaged image based on the sixteen (16) beam spot images taken at locations 1 through 16. In some embodiments, the beam spot images may be greyscale images each including plurality of pixels, and each pixel has a grey level. The controller may calculate, for at least one pixel, an averaged grey level based on the grey levels of all corresponding pixels in the plurality of images. For example, in the example of the 4×4 matrix illustrated in FIG. 8A, for a pixel at a position (x, y), the controller may sum up the grey levels of all of the pixels at the position (x, y) in all of the sixteen (16) images, and divide the obtained grey level by 16 to obtain an averaged grey level for the pixel. FIG. 8B is a diagram of an exemplary 3D beam profile obtained based on an averaged image that is generated based on the sixteen (16) beam spot images captured at locations 1 through 16. As shown in FIG. 8B, the intensity of the beam spot in the averaged image is smoothly distributed.

Typically, an image sensor has a dynamic range of 8 bits, 10 bits, or 16 bits. Because a light beam (e.g., laser beam) may have a high intensity, or the beam intensity may vary dramatically from the center to the edge of a light beam, it may be hard to obtain the entire beam profile (i.e., entire intensity distribution) of the light beam by an image sensor due to the limited dynamic range of the image sensor. According to some embodiments of the present disclosure, to overcome the limited dynamic range of image sensors and to avoid using over-exposure pixel information, the complete beam profile may be restored by using images of a beam spot taken at different exposure times. As used herein, the exposure time represents the length of time when a film or a digital sensor in an image sensor is exposed to light. This method may be referred to as a dynamic range extension method.

Figure 9:
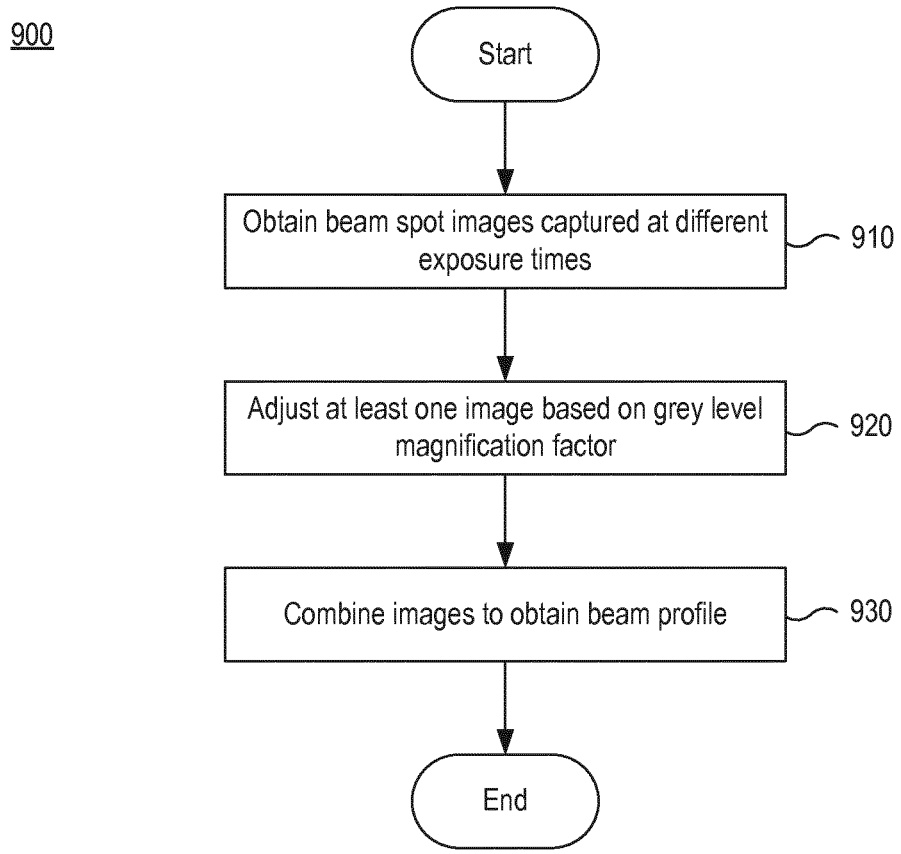
FIG. 9 is an exemplary flowchart of a process for obtaining a beam profile using a dynamic range extension method, consistent with embodiments of the present disclosure.

FIG. 9 is a flowchart of a process 900 for obtaining a beam profile using the dynamic range extension method, consistent with embodiments of the present disclosure. Process 900 may be performed by a controller, such as controller 380 illustrated in FIG. 3A.

Figure 10A:
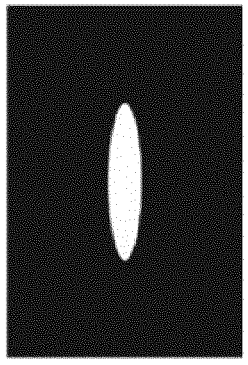
FIGS. 10A-10C are examples of beam spot images taken at different exposure times, consistent with embodiments of the present disclosure.
Figure 10B:
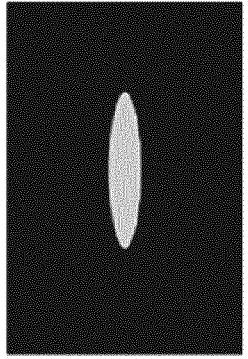
Figure 10C:
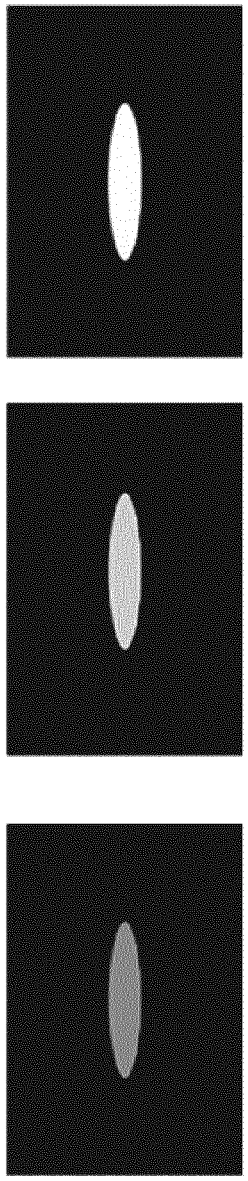
Figure 10D:
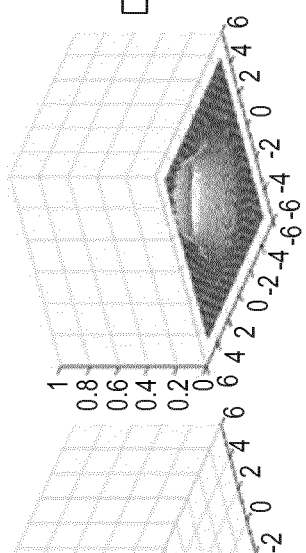
FIGS. 10D-10F are examples of partial beam profiles obtained from the beam spot images of FIGS. 10A-10C, consistent with embodiments of the present disclosure.
Figure 10E:
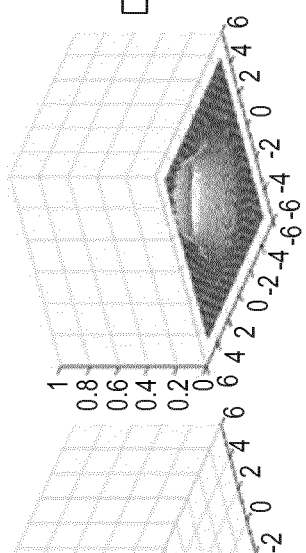
Figure 10F:
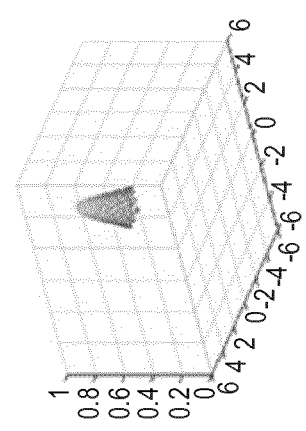

As shown in FIG. 9, at step 910, the controller may first obtain a sequence of images of a beam spot captured at different exposure times of an image sensor, such as image sensor 360 of FIG. 3A. That is, each image of the sequence of images has been captured by the image sensor at a different exposure time of the image sensor. The exposure times may range from the shorted exposure time that is available for the image sensor, to an exposure time that is long enough to capture an edge of the beam spot. The different exposure times may be selected to ensure that partial beam profiles obtained from the sequence of images overlap with each other. FIGS. 10A-10C are examples of images of a beam spot captured at exposure times t1, t2, and t3. FIGS. 10D-10F are examples of partial beam profiles obtained from the images of FIGS. 10A-10C, respectively. Exposure time t1 is the shortest time among t1, t2, and t3. Exposure time t1 may yield a first partial beam profile at a high level, as shown in FIG. 10D. Then, by increasing the exposure time to t2, a second partial beam profile at a middle level as shown in FIG. 10E can be obtained. Next, the exposure time is increased to t3, which may yield a third partial beam profile at a low level, as shown in FIG. 10F. The partial beam profiles at FIGS. 10D-10F partially overlap with each other.

At step 920, the controller may adjust at least one beam spot image by using a grey level magnification factor for the at least one beam spot image. Here, in order to overcome limited dynamic range of the image sensor, the controller may first sort out useful pixel information by selecting pixels (also referred to as "pixels containing useful information") within or without a dynamic range from all of the pixels in the image. The pixels without useful information (also referred to as "un-useful pixels") may be discarded or ignored by the controller. In other words, in some embodiments, only pixels with useful information are used in processing. The controller may adjust the beam spot image by, for example, multiplying a grey level of each pixel containing useful information in the beam spot image by a grey level magnification factor for the image.

In some embodiments, the controller may determine a grey level magnification factor for a beam spot image based on an exposure time at which the beam spot image is captured. The grey level magnification factor may be inversely related to the exposure time. The longer the exposure time, the lower the grey level magnification factor is; and vice versa. For example, a grey level magnification factor for a first selected beam spot image may be calculated by dividing a first exposure time at which the first selected beam spot image is captured by a second exposure time at which a second selected beam spot image is captured.

In some other embodiments, the controller may determine a grey level magnification factor based on the grey levels of the same pixel at different exposure times. For example, the controller may determine a grey level magnification factor associated with a beam spot image by comparing grey levels of the pixels in the beam spot image with grey levels of the pixels in other beam spot images. FIGS. 11A-11G illustrate an exemplary method of determining a grey level magnification factor, according to these embodiments.

Specifically, FIG. 11A is a first exemplary beam spot image collected at exposure time t1. FIG. 11B is a second exemplary beam spot image collected at exposure time t2. FIG. 11C is a diagram of grey levels of pixels (i.e., useful pixels) in the first and second beam spot images of FIGS. 11A and 11B, when viewed along an x-axis on a sample surface where the beam spot is formed. In the diagram of FIG. 11C, the values on the horizontal axis represent positions along the x-axis, and the values on the vertical axis represent grey levels. FIG. 11D is a top view of grey levels of the useful pixels in the first and second beam spot images of FIGS. 11A and 11B. In the diagram of FIG. 11D, the values on the horizontal axis represent positions along the x-axis, and the values on the vertical axis represent positions along a y-axis perpendicular to the x-axis. Controller 380 may compare the grey levels of the first and second beam spot images to obtain a plurality of overlapping pixel pairs. The pixels in each overlapping pixel pair have same positions in the corresponding beam spot images. FIG. 11E is a diagram of grey levels of the plurality of overlapping pixel pairs, when viewed along the x-axis on the sample surface where the beam spot is formed. FIG. 11F is a top view of grey levels of the plurality of overlapping pixel pairs. The controller may determine the grey level magnification factor associated with the first beam spot image based on the grey levels of the overlapping pixel pairs by using at least one of two exemplary methods described as follows.

In the first exemplary method, the controller may determine an individual grey level magnification factor for each overlapping pixel pair based on a ratio of the grey levels of the pair of overlapping pixels. For example, for an overlapping pixel pair consisting of a first pixel from the first beam spot image and a second pixel from the second beam spot image, the controller may determine the individual grey level magnification factor by, for example, dividing the grey level of the second pixel by the grey level of the first pixel. The controller may then determine the grey level magnification factor associated with the first beam spot image by, for example, averaging the individual grey level magnification factors of all of the plurality of overlapping pixel pairs.

In the second exemplary method, assuming that the plurality of overlapping pixel pairs consist of a first set of pixels from the first beam spot image and a second set of pixels from the second beam spot image, the controller may obtain a first total grey level by summing the grey levels of the first set of pixels, and obtain a second total grey level by summing the grey levels of the second set of pixels. The controller may then determine the grey level magnification factor associated with the first beam spot image by dividing the first total grey level by the second total grey level.

After determining the grey level magnification factor associated with the first beam spot image, the controller may adjust the first beam spot image by, for example, multiplying a grey level of each pixel containing useful information in the first beam spot image by the grey level magnification factor. The controller may then combine the grey levels in the adjusted first beam spot image and the grey levels in the second beam spot image to obtain a beam profile. FIG. 11G is a diagram of grey levels in the beam profile obtained by controller 380.

Figure 10G:
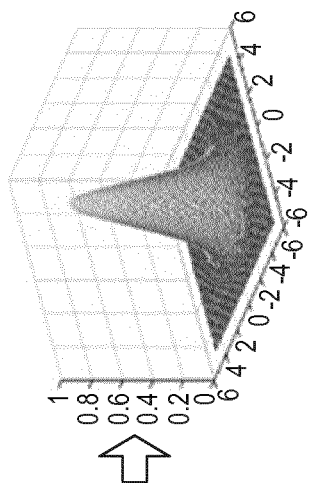
FIG. 10G is a complete beam profile obtained based on the beam spot images FIGS. 10A-10C, consistent with embodiments of the present disclosure.

Referring back to FIG. 9, at step 930, the controller may combine the sequence of images to obtain a beam profile. For example, the controller may combine the beam spot images in FIGS. 10A-10C by aligning the partial beam profiles in FIGS. 10D-10F obtained from the beam spot images and obtain the complete beam profile shown in FIG. 10G. The complete beam profile can be used to monitor the beam quality.

In the example illustrated in FIGS. 10A-10G, three (3) beam spot images are used to obtain the complete beam profile. The present disclosure is not limited thereto, and less or more images taken at different exposure times may be used to obtain the complete beam profile. Usually, 5 to 13 beam spot images may be used. In some cases where the dynamic range of an image sensor is large enough, a single beam spot image may be sufficient to generate the complete beam profile.

Figure 12:
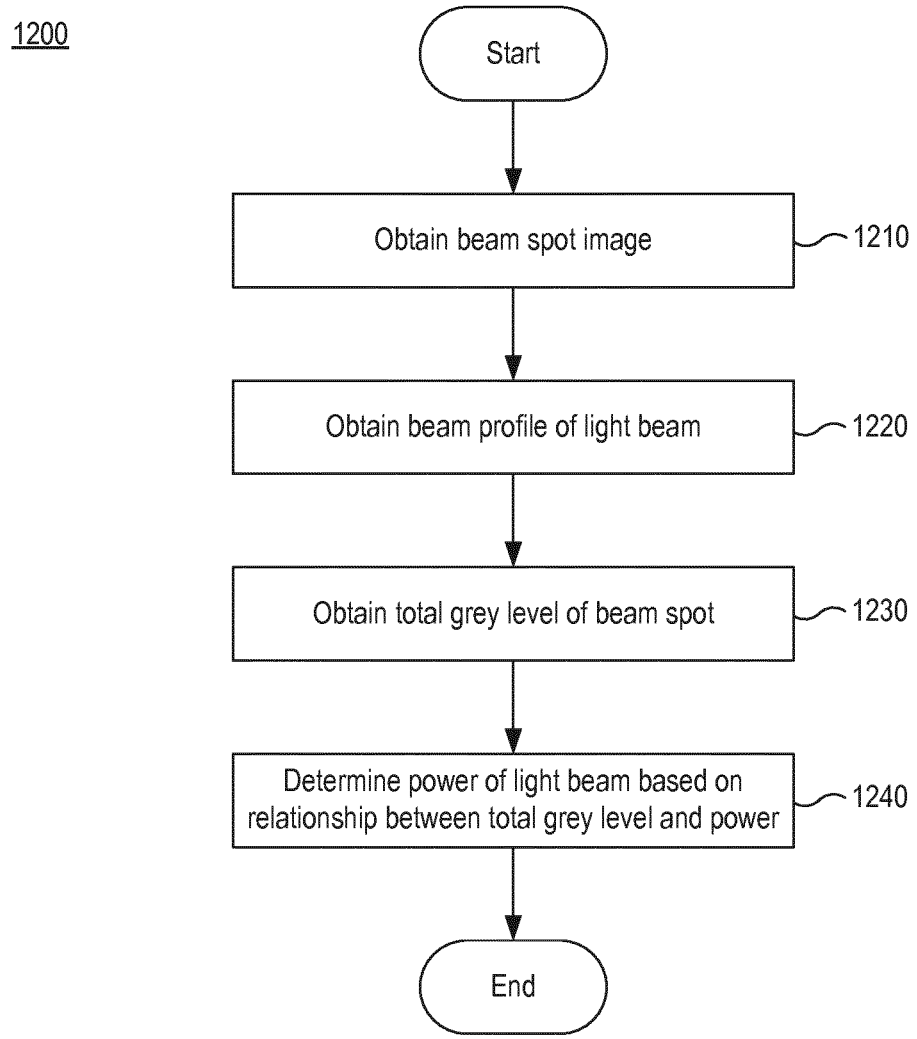
FIG. 12 is an exemplary flowchart of a process for determining a beam power using a power calibration method, consistent with embodiments of the present disclosure.

According to some embodiments of the present disclosure, the power of a light beam ("beam power") can also be determined based on a beam spot image captured by an image sensor. This method is referred to as a power calibration method. FIG. 12 is a flow chart of a process 1200 of determining a beam power using the power calibration method, consistent with such embodiments. Process 1200 may be performed by a controller, such as controller 380 in FIG. 3A.

As shown in FIG. 12, at step 1210, the controller may obtain a beam spot image of a light beam captured by an image sensor, such as image sensor 360 in FIG. 3A. At step 1220, the controller may obtain a beam profile of the light beam based on the beam spot image. For example, the controller may obtain the beam profile using the method described with respect to FIG. 9. At step 1230, the controller may obtain a total grey level of the beam spot by, for example, summing the grey levels of all pixels in the beam profile. At step 1240, the controller may determine a power of the light beam based on a relationship between the beam power and the total grey level.

The total grey level GL can be written as:

$$GL = Power * \beta * \eta$$

where Power is the power of the beam spot from on a diffraction surface, which could be measured by a power meter, $\beta$ is an energy diffraction efficiency onto the image sensor, $\eta$ is a power to grey level conversion ratio. The $\beta*\eta$ represents a relationship between the Power and the total grey level GL. The $\beta*\eta$ may be calibrated before operation of an inspection system (e.g., inspection system 100) and may be stored in a memory.

For example, to calibrate the $\beta*\eta$, the controller may first obtain an image of a sample beam spot (hereinafter referred to as a "sample beam spot image") of a sample light beam captured by an image sensor, such as image sensor 360 of FIG. 3A. The beam spot image may be captured inside or outside a vacuum chamber. The controller may obtain a beam profile of the sample light beam based on the beam spot image. FIG. 13A is an example of a 3D beam profile that may be obtained by the controller. After the beam profile of the sample light beam is obtained, the controller may obtain a total grey level of the sample beam spot by, for example, summing the grey levels of the pixels in the beam profile of the sample light beam. The controller may then obtain a power of a sample light beam measured by a power meter. FIG. 13B schematically illustrates a method of measuring a beam power by a power meter, consistent with some embodiments of the present disclosure. As shown in FIG. 13B, an ACC module 1300 may be configured to emit a light beam 1310 that directly enters a power meter 1320, and power meter 1320 may measure a beam power of light beam 1310. After the controller obtains the beam power of the sample light beam, the controller may determine the $\beta*\eta$, which represents a relationship between the total grey level of the sample beam spot and the power of the sample light beam. FIG. 13C is a diagram of an exemplary relationship between the beam power and total grey level of a sample light beam. In the diagram of FIG. 13C, the horizontal axis represents the beam power, and the vertical axis represents the total grey level of the beam spot. By doing this, the total grey level of the beam spot can be related with the beam power. Then the beam power of an ACC module can be monitored with the total grey level counts of a beam spot image captured by an image sensor in situ.

According to the above disclosed embodiments, a beam monitoring system for monitoring a light beam emitted from an ACC module in an inspection system may include an image sensor configured to collect a sequence of images of a beam spot formed by the light beam at different exposure times of the image sensor, and a controller configured to combine the sequence of images to obtain a beam profile of the light beam. As a result, even if the image sensor has a dynamic range that is not sufficiently large to capture the complete beam profile of the light beam, the controller can still obtain the complete beam profile based on the partial beam files obtained from the sequence of images.

In addition, the controller may be configured to, for at least one of the sequence of images, transform coordinates of the image based on positions of the light and the image sensor with respect to the beam spot and a magnification factor of an optical system arranged between the image sensor and the surface. As a result, a projection of the light beam on the surface may be obtained, and an interaction between the light beam and the surface can be accurately evaluated.

Moreover, the image sensor may be configured to, at least one exposure time, collect a plurality of images of the beam spot formed at different locations on the surface, and the controller may be configured to generate an averaged image based on the plurality of images and use the averaged image as the collected image for the at least one exposure time. As a result, the beam profile obtained based on the averaged image may be smooth, even if the surface on which the beam spot is formed is relatively rough.

Furthermore, the controller may be configured to obtain a total grey level of the beam spot by summing the grey levels of all pixels in the beam profile and determine a power of the light beam based on a predetermined relationship between the total grey level and the power. As a result, the beam power may be obtained in situ while the inspection system is operating, without using a power meter.

The embodiments may further be described using the following clauses:

1. A system for monitoring a beam in an inspection system, comprising:
   an image sensor that includes circuitry to collect a sequence of images of a beam spot of a beam formed on a surface, each image of the sequence of images having been collected at a different exposure time of the image sensor; and
   a controller having one or more processors and a memory, the controller configured to combine the sequence of images to obtain a beam profile of the beam.

2. The system of clause 1, wherein the controller is further configured to adjust an image of the sequence of images by using a grey level magnification factor associated with the image.

3. The system of clause 2, wherein the controller is further configured to adjust the image by multiplying a grey level of each pixel in the image that contains useful information by the grey level magnification factor associated with the image.

4. The system of either one of clauses 2 and 3, wherein the controller is configured to determine the grey level magnification factor associated with the image based on an exposure time at which the image is collected.

5. The system of either one of clauses 2 and 3, wherein the controller is configured to determine the grey level magnification factor associated with the image based on a comparison of grey levels of pixels in the sequence of images.

6. The system of clause 5, wherein the image is a first selected image of the sequence of images, and the controller is configured to determine the grey level magnification factor associated with the first selected image based on:
   a comparison of the first selected image with a second selected image of the plurality of images to obtain a plurality of overlapping pixel pairs; and
   a determination of the grey level magnification factor associated with the first selected image based on grey levels of pixels in the plurality of overlapping pixel pairs.

7. The system of any one of clauses 1 to 6, wherein the controller is further configured to, for a particular image of the sequence of images, transform coordinates of the particular image based on positions of the beam and the image sensor with respect to the beam spot and a magnification factor of an optical system arranged between the image sensor and the surface.

8. The system of any one of clauses 1 to 7, wherein
   the image sensor includes circuitry to, at an exposure time, collect a plurality of images of the beam spot formed at different locations on the surface, and
   the controller is configured to:
      generate an averaged image based on the plurality of images; and
      use the averaged image as the collected image for the exposure time.

9. The system of clause 8, wherein the controller is configured to generate the averaged image by:
   for a pixel, determine an averaged grey level based on the grey levels of pixels in the plurality of images.

10. The system of any one of clauses 1 to 9, wherein the controller is further configured to:
    obtain a total grey level of the beam spot by summing the grey levels of all pixels in the beam profile; and
    determine a power of the beam based on a relationship between the total grey level and the power.

11. The system of clause 10, wherein the controller is configured to determine the relationship between the total grey level and the power by:

obtaining a power of a sample beam measured by a power meter;

obtaining an image of a sample beam spot formed by the sample beam;

obtaining a beam profile of the sample beam based on the image of the sample beam;

obtaining a total grey level of the sample beam spot by summing the grey levels of the pixels in the beam profile of the sample beam;

determining a relationship between the total grey level of the sample beam spot and the power of the sample beam; and determining the relationship between the total grey level and the power based on the relationship between the total grey level of the sample beam spot and the power of the sample beam.

12. The system of either one of clauses 10 and 11, wherein the inspection system further includes an emitter that includes circuitry to emit the beam, and the controller is further configured to adjust an output power of the emitter based on the determined power of the beam.

13. The system of any one of clauses 1 to 12, wherein the inspection system further includes an emitter that includes circuitry to emit the beam, and the emitter includes a beam shaper, and the controller is further configured to control the beam shaper based on the beam profile of the beam.

14. The system of any one of clauses 1 to 13, wherein the inspection system further includes a charged particle beam tool that includes circuitry to emit a charged particle beam onto the surface.

15. The system of clause 14, wherein the controller is further configured to align the beam spot of the beam to a field of view of the charged particle beam tool.

16. The system of clause 14, wherein the inspection system further includes an Advanced Charge Control module that includes circuitry to emit the beam.

17. The system of clause 16, wherein the charged particle beam tool, the Advanced Charge Control module, and the image detector are disposed outside of a vacuum chamber.

18. A method of monitoring a beam in an inspection system, comprising:

obtaining a sequence of images of a beam spot of a beam formed on a surface, each image of the sequence of images having been collected by an image sensor at a different exposure time of the image sensor; and combining the sequence of images to obtain a beam profile of the beam.

19. The method of clause 18, further comprising adjusting an image of the sequence of images by using a grey level magnification factor associated with the image.

20. The method of clause 19, wherein adjusting the image of the sequence of images comprises:

multiplying a grey level of each pixel in the image that contains useful information by the grey level magnification factor associated with the image.

21. The method of either one of clauses 19 and 20, further comprising determining the grey level magnification factor associated with the image based on an exposure time at which the image is collected.

22. The method of either one of clauses 19 and 20, further comprising determining the grey level magnification factor associated with the image based on a comparison of grey levels of pixels in the sequence of images.

23. The method of clause 22, wherein the image is a first selected image of the sequence of images, and the method further comprises:

comparing the first selected image with a second selected image of the plurality of images to obtain a plurality of overlapping pixel pairs; and determining the grey level magnification factor associated with the first selected image based on grey levels of pixels in the plurality of overlapping pixel pairs.

24. The method of any one of clauses 18 to 23, further comprising, for a particular image of the sequence of images, transforming coordinates of the particular image based on positions of the beam and the image sensor with respect to the beam spot and a magnification factor of an optical system arranged between the image sensor and the surface.

25. The method of any one of clauses 18 to 24, further comprising:

obtaining a plurality of images of the beam spot formed at different locations on the surface; and generating an averaged image based on the plurality of images.

26. The method of clause 25, wherein the generating the averaged image comprising:

for a pixel, determining an averaged grey level based on the grey levels of the pixels in the plurality of images.

27. The method of any one of clauses 18 to 26, further comprising:

obtaining a total grey level of the beam spot by summing the grey levels of all of the pixels in the beam profile; and determining a power of the beam based on a predetermined relationship between the total grey level and the power.

28. The method of clause 27, further comprising determining the relationship between the total grey level and the power by:

obtaining a power of a sample beam measured by a power meter;

obtaining an image of a sample beam spot formed by the sample beam;

obtaining a beam profile of the sample beam based on the image of the sample beam;

obtaining a total grey level of the sample beam spot by summing the grey levels of the pixels in the beam profile of the sample beam;

determining a relationship between the total grey level of the sample beam spot and the power of the sample beam; and determining the relationship between the total grey level and the power based on the relationship between the total grey level of the sample beam spot and the power of the sample beam.

29. The method of either one of clauses 27 and 28, wherein the inspection system further includes an emitter that emits the beam, and the method further comprises adjusting an output power of the emitter based on the determined power of the beam.

30. The method of any one of clauses 18 to 29, wherein the inspection system further includes an emitter that emits the beam, and the emitter includes a beam shaper, and the method further comprises controlling the beam shaper based on the beam profile of the beam.

31. The method of any one of clauses 18 to 30, wherein the inspection system further includes an emitter that emits the beam and a charged particle beam tool that emits a charged particle beam onto the surface,
the method further comprises aligning the beam spot of the beam to a field of view of the charged particle beam tool.

32. A non-transitory computer-readable medium that stores a set of instructions that is executable by a processor of a system for monitoring a beam in an inspection system to cause the system to perform a method, the method comprising:
obtaining a sequence of images of a beam spot of a beam formed on a surface, each image of the sequence of images having been collected by an image sensor at a different exposure time of the image sensor; and
combining the sequence of images to obtain a beam profile of the beam.

33. The medium of clause 32, wherein the set of instructions that is executable by the processor of the system further causes the system to perform:
adjusting an image of the sequence of images by using a grey level magnification factor associated with the image.

34. The medium of clause 33, wherein adjusting the image of the sequence of images comprises:
multiplying a grey level of each pixel in the image that contains useful information by the grey level magnification factor associated with the image.

35. The medium of either one of clauses 33 and 34, wherein the set of instructions that is executable by the processor of the system further causes the system to perform:
determining the grey level magnification factor associated with the image based on an exposure time at which the image is collected.

36. The medium of either one of clauses 33 and 34, wherein the set of instructions that is executable by the processor of the system further causes the system to perform:
determining the grey level magnification factor associated with the image based on a comparison of grey levels of pixels in the sequence of images.

37. The medium of clause 36, wherein the image is a first selected image of the sequence of images, and the set of instructions that is executable by the processor of the system further causes the system to perform:
comparing the first selected image with a second selected image of the plurality of images to obtain a plurality of overlapping pixel pairs; and
determining the grey level magnification factor associated with the first selected image based on grey levels of pixels in the plurality of overlapping pixel pairs.

38. The medium of any one of clauses 18 to 23, wherein the set of instructions that is executable by the processor of the system further causes the system to perform:
for a particular image of the sequence of images, transforming coordinates of the particular image based on positions of the beam and the image sensor with respect to the beam spot and a magnification factor of an optical system arranged between the image sensor and the surface.

39. The medium of any one of clauses 32 to 38, wherein the set of instructions that is executable by the processor of the system further causes the system to perform:
obtaining a plurality of images of the beam spot formed at different locations on the surface; and
generating an averaged image based on the plurality of images.

40. The medium of clause 39, wherein generating the averaged image comprising:
for a pixel, determining an averaged grey level based on the grey levels of the pixels in the plurality of images.

41. The medium of any one of clauses 32 to 40, wherein the set of instructions that is executable by the processor of the system further causes the system to perform:
obtaining a total grey level of the beam spot by summing the grey levels of all of the pixels in the beam profile; and
determining a power of the beam based on a predetermined relationship between the total grey level and the power.

42. The medium of clause 41, wherein the set of instructions that is executable by the processor of the system further causes the system to perform:
determining the relationship between the total grey level and the power by:
obtaining a power of a sample beam measured by a power meter;
obtaining an image of a sample beam spot formed by the sample beam;
obtaining a beam profile of the sample beam based on the image of the sample beam;
obtaining a total grey level of the sample beam spot by summing the grey levels of the pixels in the beam profile of the sample beam;
determining a relationship between the total grey level of the sample beam spot and the power of the sample beam; and
determining the relationship between the total grey level and the power based on the relationship between the total grey level of the sample beam spot and the power of the sample beam.

43. The medium of either one of clauses 41 and 42, wherein the inspection system further includes an emitter that emits the beam, and the set of instructions that is executable by the processor of the system further causes the system to perform:
adjusting an output power of the emitter based on the determined power of the beam.

44. The medium of any one of clauses 32 to 43, wherein the inspection system further includes an emitter that emits the beam, and the emitter includes a beam shaper, and the set of instructions that is executable by the processor of the system further causes the system to perform:
controlling the beam shaper based on the beam profile of the beam.

45. The medium of any one of clauses 18 to 30, wherein the inspection system further includes an emitter that emits the beam and a charged particle beam tool that emits a charged particle beam onto the surface, the set of instructions that is executable by the processor of the system further causes the system to perform:
aligning the beam spot of the beam to a field of view of the charged particle beam tool.

46. A system for monitoring a beam in an inspection system, comprising:
an image sensor that includes circuitry to collect an image of a beam spot of a beam formed on a surface; and
a controller having one or more processors and a memory, the controller configured to transform coordinates of the image based on positions of the beam and the image sensor with respect to the beam spot and a magnification factor of an optical system arranged between the image sensor and the surface.

47. A method of monitoring a beam in an inspection system, comprising:
collecting, by an image sensor, an image of a beam spot of a beam formed on a surface; and
transforming coordinates of the image based on positions of the beam and the image sensor with respect to the beam spot and a magnification factor of an optical system arranged between the image sensor and the surface.

48. A non-transitory computer-readable medium that stores a set of instructions that is executable by a processor of a system for monitoring a beam in an inspection system to cause the system to perform a method, the method comprising:
receiving an image of a beam spot of a beam formed on a surface and collected by an image sensor; and
transforming coordinates of the image based on positions of the beam and the image sensor with respect to the beam spot and a magnification factor of an optical system arranged between the image sensor and the surface 49. A system for monitoring a beam in an inspection system, comprising:
an image sensor that includes circuitry to collect a plurality of images of a beam spot of a beam, each image of the plurality of images being formed at a different location on a surface; and
a controller having one or more processors and a memory, the controller configured to generate an averaged image based on the plurality of images.

50. The system of clause 49, wherein the controller is configured to generate the averaged image by:
for a pixel, determine an averaged grey level based on the grey levels of the pixels in the plurality of images.

51. A method of monitoring a beam in an inspection system, comprising:
collecting a plurality of images of a beam spot of a beam, each image of the plurality of images being formed at a different location on a surface; and
generating an averaged image based on the plurality of images.

52. The method of clause 51, wherein the generating the averaged image comprises:
for a pixel, determining an averaged grey level based on the grey levels of the pixels in the plurality of images.

53. A non-transitory computer-readable medium that stores a set of instructions that is executable by a processor of a system for monitoring a beam in an inspection system to cause the system to perform a method, the method comprising:
receiving a plurality of images of a beam spot of a beam, each image of the plurality of images being formed at a different location on a surface; and
generating an averaged image based on the plurality of images.

54. The medium of clause 53, wherein the generating the averaged image comprises:
for a pixel, determining an averaged grey level based on the grey levels of the pixels in the plurality of images.

55. A system for monitoring a beam in an inspection system, comprising:
an image sensor that includes circuitry to collect an image of a beam spot of a beam formed on a surface; and
a controller having one or more processors and a memory, the controller configured to:
obtain a beam profile of the beam based on the image;
obtain a total grey level of the beam spot based on the beam profile; and
determine a power of the beam based on a predetermined relationship between the total grey level and the power.

56. The system of clause 55, wherein the controller is configured to determine the predetermined relationship between the total grey level and the power by:
obtaining a power of a sample beam measured by a power meter;
obtaining an image of a sample beam spot formed by the sample beam;
obtaining a beam profile of the sample beam based on the image of the sample beam;
obtaining a total grey level of the sample beam spot by summing the grey levels of the pixels in the beam profile of the sample beam;
determining a relationship between the total grey level of the sample beam spot and the power of the sample beam; and
determining the relationship between the total grey level and the power based on the relationship between the total grey level of the sample beam spot and the power of the sample beam.

57. The system of either one of clauses 55 and 56, wherein the inspection system further includes an emitter that includes circuitry to emit the beam, and
the controller is further configured to adjust an output power of the emitter based on the determined power of the beam.

58. The system of any one of clauses 55 to 57, wherein the inspection system further includes a charged particle beam tool that that includes circuitry to emit a charged particle beam onto the surface.

59. The system of clause 58, wherein the inspection system further includes an Advanced Charge Control module that includes circuitry to emit the beam.

60. The system of clause 59, wherein the charged particle beam tool, the Advanced Charge Control module, and the image detector are disposed outside of a vacuum chamber.

61. A method of monitoring a beam in an inspection system, comprising:
collecting an image of a beam spot of a beam formed on a surface;
obtaining a beam profile of the beam based on the image;
obtaining a total grey level of the beam spot based on the beam profile; and
determining a power of the beam based on a predetermined relationship between the total grey level and the power.

62. The method of clause 61, further comprising determining the relationship between the total grey level and the power by:
obtaining a power of a sample beam measured by a power meter;
obtaining an image of a sample beam spot formed by the sample beam;
obtaining a beam profile of the sample beam based on the image of the sample beam;
obtaining a total grey level of the sample beam spot by summing the grey levels of the pixels in the beam profile of the sample beam;
determining a relationship between the total grey level of the sample beam spot and the power of the sample beam; and determining the relationship between the total grey level and the power based on the relationship between the total grey level of the sample beam spot and the power of the sample beam.

63. A non-transitory computer-readable medium that stores a set of instructions that is executable by a processor of a system for monitoring a beam in an inspection system to cause the system to perform a method, the method comprising:
receiving an image of a beam spot of a beam formed on a surface;
obtaining a beam profile of the beam based on the image;
obtaining a total grey level of the beam spot based on the beam profile; and
determining a power of the beam based on a predetermined relationship between the total grey level and the power.

64. The non-transitory computer-readable medium of clause 63, wherein the set of instructions that is executable by the processor of the system further causes the system to perform:
determining the relationship between the total grey level and the power by:
receiving a power of a sample beam measured by a power meter;
receiving an image of a sample beam spot formed by the sample beam;
obtain a beam profile of the sample beam based on the image of the sample beam;
obtaining a total grey level of the sample beam spot by summing the grey levels of the pixels in the beam profile of the sample beam;
determining a relationship between the total grey level of the sample beam spot and the power of the sample beam; and
determining the relationship between the total grey level and the power based on the relationship between the total grey level of the sample beam spot and the power of the sample beam.

It will be appreciated that the present invention is not limited to the exact construction that has been described above and illustrated in the accompanying drawings, and that various modifications and changes can be made without departing from the scope thereof. It is intended that the scope of the invention should only be limited by the appended claims.

What is claimed is:

1. A system for monitoring a light beam in an inspection system, comprising:
a light emitter that includes circuitry to emit a light beam onto a surface of a sample and form a beam spot on the surface;
an image sensor that includes circuitry to collect a sequence of images of the beam spot formed on the surface such that each image of the sequence of images is collected at a different exposure time of the image sensor; and
a controller having one or more processors and a memory, the controller configured to combine the sequence of images to obtain a beam profile of the light beam.

2. The system of claim 1, wherein the controller is further configured to adjust an image of the sequence of images by using a grey level magnification factor associated with the image.

3. The system of claim 2, wherein the controller is further configured to adjust the image by multiplying a grey level of each pixel in the image that contains useful information by the grey level magnification factor associated with the image.

4. The system of claim 2, wherein the controller is configured to determine the grey level magnification factor associated with the image based on an exposure time at which the image is collected.

5. The system of claim 2, wherein the controller is configured to determine the grey level magnification factor associated with the image based on a comparison of grey levels of pixels in the sequence of images.

6. The system of claim 5, wherein the image is a first selected image of the sequence of images, and the controller is configured to determine the grey level magnification factor associated with the first selected image based on:
a comparison of the first selected image with a second selected image of the plurality of images to obtain a plurality of overlapping pixel pairs; and
a determination of the grey level magnification factor associated with the first selected image based on grey levels of pixels in the plurality of overlapping pixel pairs.

7. The system of claim 1, wherein the controller is further configured to transform coordinates of a particular image of the sequence of images based on positions of the light beam and the image sensor with respect to the beam spot and a magnification factor of an optical system arranged between the image sensor and the surface to obtain a projection of the light beam on the surface.

8. The system of claim 1, wherein
the image sensor includes circuitry to, at an exposure time, collect a plurality of images of the beam spot formed at different locations on the surface, and
the controller is configured to:
generate an averaged image based on the plurality of images; and
use the averaged image as the collected image for the exposure time.

9. The system of claim 8, wherein the controller is configured to generate the averaged image by:
for a pixel, determine an averaged grey level based on the grey levels of pixels in the plurality of images.

10. The system of claim 1, wherein the controller is further configured to:
obtain a total grey level of the beam spot by summing the grey levels of all pixels in the beam profile; and
determine a power of the beam based on a relationship between the total grey level and the power.

11. The system of claim 10, wherein the controller is configured to determine the relationship between the total grey level and the power by:
obtaining a power of a sample beam measured by a power meter;
obtaining an image of a sample beam spot formed by the sample beam;
obtaining a beam profile of the sample beam based on the image of the sample beam;
obtaining a total grey level of the sample beam spot by summing the grey levels of the pixels in the beam profile of the sample beam;
determining a relationship between the total grey level of the sample beam spot and the power of the sample beam; and
determining the relationship between the total grey level and the power based on the relationship between the total grey level of the sample beam spot and the power of the sample beam.

12. The system of claim 10, wherein the controller is further configured to adjust an output power of the light emitter based on the determined power of the beam.

13. The system of claim 1, wherein the inspection system further includes a beam shaper, and the controller is further configured to control the beam shaper based on the beam profile of the light beam.

14. The system of claim 1, wherein the inspection system further includes a charged particle beam tool configured to emit a charged particle beam onto the surface.

15. A non-transitory computer-readable medium that stores a set of instructions that is executable by a processor of a system for monitoring a light beam in an inspection system to cause the system to perform a method, the method comprising:

directing a light beam emitted by a light emitter onto a surface of a sample to form a beam spot on the surface;

obtaining a sequence of images of the beam spot formed on the surface, wherein each image of the sequence of images is collected by an image sensor at a different exposure time of the image sensor; and combining the sequence of images to obtain a beam profile of the light beam.

16. The system of claim 14, wherein the controller is configured to control the light emitter to form the beam spot at a location of the surface that is irradiated by the charged particle beam.

17. The system of claim 14, wherein the light emitter and the image sensor are disposed outside a vacuum chamber of the charged particle beam tool, and wherein the sample is disposed in the vacuum chamber.

18. The system of claim 14, wherein at least one of the light emitter or the image sensor is disposed inside a vacuum chamber of the charged particle beam tool, and wherein the sample is disposed in the vacuum chamber.

19. The system of claim 1, wherein the sample is a wafer.

20. The system of claim 1, wherein the light beam is a laser beam.

* * * * *